US012740052B2

(12) United States Patent
Ji et al.

(10) Patent No.: US 12,740,052 B2
(45) Date of Patent: Sep. 15, 2026

(54) METHOD OF FABRICATING SEMICONDUCTOR DEVICE WITH VOID-FREE CONDUCTIVE FEATURE

(71) Applicant: NANYA TECHNOLOGY CORPORATION, New Taipei City (TW)

(72) Inventors: Cheng-Yan Ji, New Taipei City (TW); Chu-Hsiang Hsu, New Taipei City (TW); Jing Hsu, Kaohsiung City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 959 days.

(21) Appl. No.: 17/837,705

(22) Filed: Jun. 10, 2022

(65) Prior Publication Data

US 2023/0413533 A1 Dec. 21, 2023

(51) Int. Cl.
*H10B 12/00* (2023.01)

(52) U.S. Cl.
CPC ....... *H10B 12/482* (2023.02); *H10B 12/0335* (2023.02); *H10B 12/053* (2023.02); *H10B 12/315* (2023.02); *H10B 12/34* (2023.02)

(58) Field of Classification Search
CPC ......................... H10B 12/482; H10B 12/0335; H10B 12/053; H10B 12/315; H10B 12/34
See application file for complete search history.

(56) References Cited

U.S. PATENT DOCUMENTS 6,335,261 B1 1/2002 Natzle et al.
2001/0054769 A1 12/2001 Raaijmakers et al.
2005/0170661 A1 8/2005 Economikos et al.
2006/0046421 A1* 3/2006 Iino .................... H01L 21/3141 257/E21.018
2007/0170488 A1* 7/2007 Ryu ...................... H10D 1/716 257/E27.087
2007/0269958 A1 11/2007 Li et al.
2013/0005140 A1* 1/2013 Jeng ..................... C23C 16/045 438/653
2013/0320429 A1 12/2013 Thomas
(Continued)

FOREIGN PATENT DOCUMENTS

JP 2021082838 A 5/2021
KR 101069630 B1 10/2011
(Continued)

*Primary Examiner* — Thomas K Pham
(74) *Attorney, Agent, or Firm* — MUNCY, GEISSLER, OLDS & LOWE, P.C.

(57) ABSTRACT

The present application provides a method of fabricating a semiconductor device. The method includes steps of forming a transistor in a substrate; depositing an insulative layer on the substrate; forming a first trench penetrating through the insulative layer to expose a portion of a first impurity region of the transistor; performing a first cyclic process comprising a first sequence of a first deposition step and a first removal step to deposit a conductive material in the first trench until a height of the conductive material in the first trench exceeds a predetermined height; filling the first trench with the conductive material after the first cyclic process; forming a storage capacitor contacting the first conductive feature; and depositing an isolation layer to cover the insulative layer and the storage capacitor.

12 Claims, 22 Drawing Sheets

(56) References Cited

U.S. PATENT DOCUMENTS

| | | | | |
|---|---|---|---|---|
| 2015/0179567 | A1 | 6/2015 | Govindaraju et al. | |
| 2016/0247718 | A1 | 8/2016 | Zope et al. | |
| 2018/0294266 | A1* | 10/2018 | Wang | H10B 12/09 |
| 2019/0115451 | A1 | 4/2019 | Lee et al. | |
| 2020/0144066 | A1 | 5/2020 | Jandl et al. | |
| 2020/0203352 | A1 | 6/2020 | Im et al. | |
| 2022/0181457 | A1 | 6/2022 | Yoon et al. | |

FOREIGN PATENT DOCUMENTS

| | | | |
|---|---|---|---|
| TW | 201220363 | A | 5/2012 |
| TW | 202106919 | A | 2/2021 |

* cited by examiner

METHOD OF FABRICATING SEMICONDUCTOR DEVICE WITH VOID-FREE CONDUCTIVE FEATURE

TECHNICAL FIELD

The present disclosure relates to a method of manufacturing a semiconductor device, and more particularly, to a method of fabricating a void-free trench filler.

DISCUSSION OF THE BACKGROUND

Semiconductor devices are employed in various systems for a wide variety of applications. Device fabrication typically involves a series of processing steps including depositing material layers on a semiconductor wafer, patterning and etching one or more of the material layers, doping selected layers, and cleaning the wafer.

Semiconductor manufacturers continually seek new ways to improve performance, decrease cost and increase capacity of semiconductor devices. Capacity and cost improvements may be achieved by reducing device size. For example, in a dynamic random-access memory (DRAM) chip, more memory cells can fit onto the chip if the sizes of memory cell components, such as capacitors and transistors, are reduced. The size reduction results in greater memory capacity for the chip. Cost reduction is achieved through economies of scale. Unfortunately, performance can suffer when the sizes of device components are reduced. Therefore, a major challenge in the industry today is balancing performance improvement with other manufacturing constraints.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a method of fabricating a conductive feature. The method includes steps of depositing an insulative layer on a substrate, forming a trench in the insulative layer, performing a cyclic process comprising a sequence of a deposition step and a removal step to deposit a conductive material in the trench until a number of times the deposition step has been performed is equal to a first preset number of times and a number of the times the removal step has been performed is equal to a second preset number of times, and filling the trench with the conductive material after the cyclic process.

In some embodiments, the deposition step of the cyclic process terminates before an upper end of the trench is blocked.

In some embodiments, the deposition step of the cyclic process is conducted until a thickness of the conductive material accumulated at the upper end of the trench is equal to one quarter of a width of the trench.

In some embodiments, the removal step is conducted to at least remove a portion of the conductive material accumulated at the upper end of the trench.

In some embodiments, the removal step removes the conductive material isotropically from the trench.

In some embodiments, the trench has an aspect ratio of substantially greater than or equal to 5.

In some embodiments, the aspect ratio is in a range of between 6 and 8.

In some embodiments, the method further includes a step of performing a planarization process to remove the conductive material above the insulative layer after the conductive material completely fills the trench.

One aspect of the present disclosure provides a method of fabricating a conductive feature. The method includes steps of depositing an insulative layer on a substrate, forming a trench in the insulative layer, performing a cyclic process comprising a sequence of a deposition step and a removal step to deposit a conductive material in the trench until a height of the conductive material in the trench is greater than a predetermined height, and filling the trench with the conductive material after the cyclic process.

In some embodiments, the deposition step of the cyclic process terminates before an upper end of the trench is blocked.

In some embodiments, the deposition step of the cyclic process is conducted until a thickness of the conductive material accumulated at the upper end of the trench reaches a critical limit, wherein the critical limit is equal to one quarter of a width of the trench.

In some embodiments, the removal step is conducted to at least remove a portion of the conductive material at the upper end of the trench.

In some embodiments, the predetermined height is equal to one half of a height of the trench.

In some embodiments, the trench has an aspect ratio of substantially greater than or equal to 5.

In some embodiments, the aspect ratio is in a range of between 6 and 8.

In some embodiments, the method further includes a step of performing a planarization process to remove the conductive material above the insulative layer after the conductive material completely fills the trench.

One aspect of the present disclosure provides a method of fabricating a conductive feature. The method includes steps of forming a transistor in a substrate; depositing an insulative layer on the substrate; forming a first trench penetrating through the insulative layer to expose a portion of a first impurity region of the transistor; performing a first cyclic process comprising a first sequence of a first deposition step and a first removal step to deposit a conductive material in the first trench until a height of the conductive material in the first trench exceeds a predetermined height; filling the first trench with the conductive material after the first cyclic process; forming a storage capacitor contacting the first conductive feature; depositing an isolation layer to cover the insulative layer and the storage capacitor; forming a second trench penetrating through the isolation layer and the insulative layer to expose a portion of a second impurity region of the transistor; performing a second cyclic process comprising a second sequence of a second deposition step and a second removal step to deposit the conductive material in the second trench until a number of times the second deposition step has been performed is equal to a third preset number of times and a number of times of the second removal step has been performed is equal to a fourth preset number of times; filling the second trench with the conductive material after the second cyclic process to thus form a second conductive feature; and forming a bit line connected to the second conductive feature.

In some embodiments, the first deposition step of the first cyclic process terminates before an upper end of the first trench is blocked, or the second deposition step of the second cyclic process terminates before an upper end of the second trench is blocked.

In some embodiments, during the formation of the first conductive feature, the first deposition step is conducted until a first thickness of the conductive material accumulated at an upper end of the first trench is equal to one quarter of a width of the first trench, or during the formation of the second conductive feature, the second deposition step is conducted until a second thickness of the conductive material accumulated at the upper end of the second trench is equal to one quarter of a width of the second trench.

In some embodiments, the first removal step is conducted to at least remove a portion of the conductive material accumulated at the upper end of the first trench, or the second removal is conducted to at least remove a portion of the conductive material accumulated at the upper end of the second trench.

In some embodiments, the first removal step removes the conductive material isotropically from the first trench, and the second removal step removes the conductive material isotropically from the second trench.

In some embodiments, the first trench and second trench respectively have an aspect ratio of substantially greater than or equal to 5.

In some embodiments, the aspect ratio is in a range of between 6 and 8.

In some embodiments, the method further includes a step of performing planarization processes to remove the conductive material overflowing the first trench after the conductive material completely fills the first trench and to remove the conductive material above the isolation layer after the second trench is filled with the conductive material.

In some embodiments, the predetermined height is equal to one half of a height of the first trench.

In some embodiments, the formation of the transistor includes steps of forming at least one groove in the substrate; depositing a gate insulator conformal to the groove; forming a word line surrounded by the gate insulator; depositing a capping layer in the groove to cover the word line; and introducing dopants into the substrate to form the first and second impurity regions.

In some embodiments, the substrate comprises an isolation feature defining a plurality of active regions, wherein the groove extends across the plurality of active regions.

In some embodiments, the formation of the storage capacitor includes steps of forming a storage node in contact with the first conductive feature; depositing a capacitor insulator encapsulating the storage node; and depositing a top electrode on the capacitor insulator.

In some embodiments, the storage node is in a U-shaped configuration.

With the above-mentioned cyclic process including the sequence of the deposition step and the removal step, the overhangs at the upper ends of the first and second trenches are trimmed before top openings of the first and second trenches are blocked; therefore, the first and second conductive features can be created in a void-free manner.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
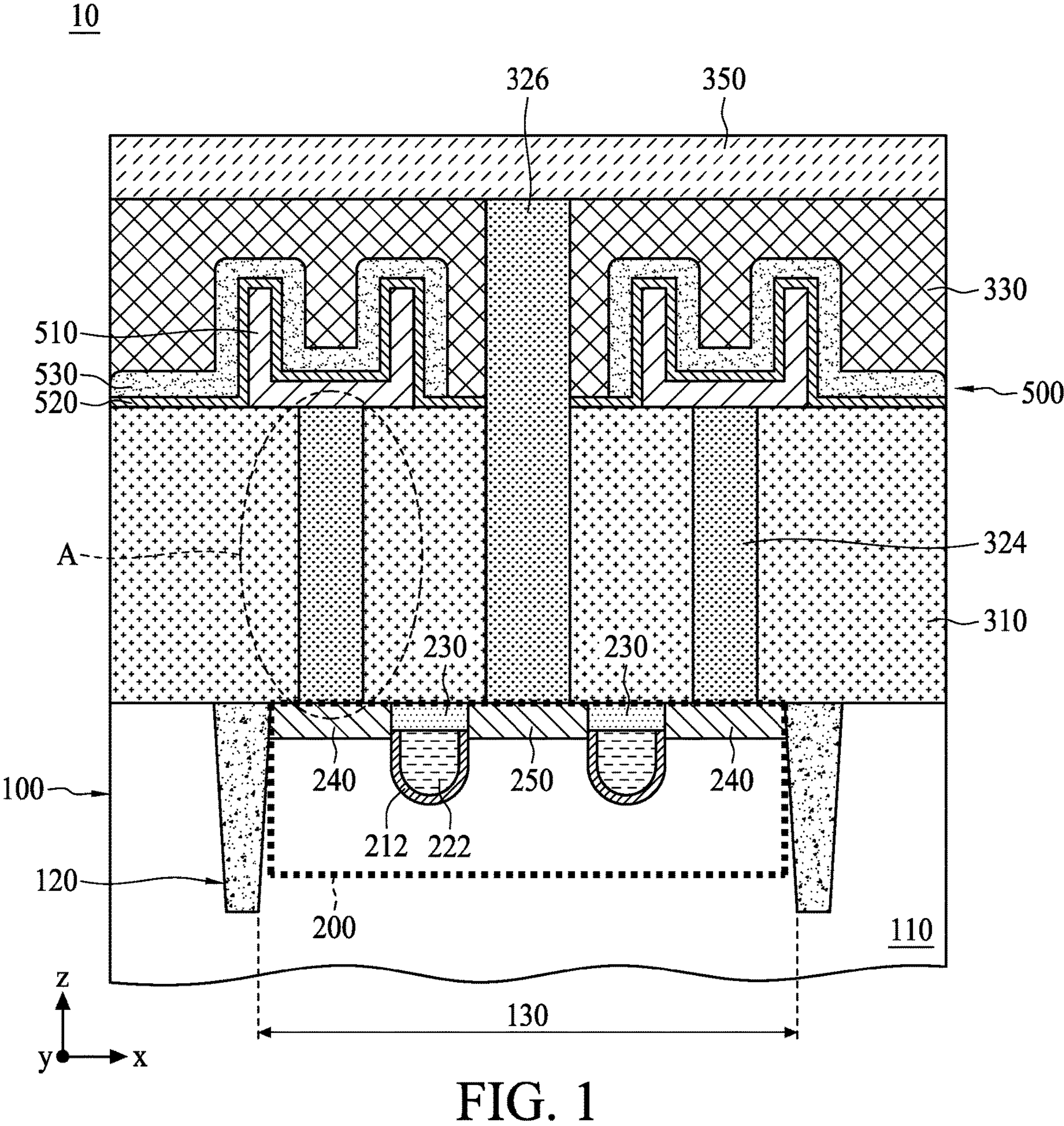
FIG. 1 is a cross-sectional view of a semiconductor device in accordance with some embodiments of the present disclosure.

Embodiments, or examples, of the disclosure illustrated in the drawings are described below using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a cross-sectional view of a semiconductor device 10 in accordance with some embodiments of the present disclosure. Referring to FIG. 1, the semiconductor device 10 may be a semiconductor memory device such as a dynamic random-access memory (DRAM) that includes one or more access transistors 200 and one or more storage capacitors 500, wherein the access transistors 200 are rendered conductive in response to a voltage conducted thereon, which couples the storage capacitors 500 to associated bit lines 350. The access transistors 200 shown in FIG. 1 are in a form of a recessed access device (RAD) transistor; however, in some embodiments, the access transistors 200 may be planar access device (PAD) transistors. Each of the access transistors 200 acts as a switch for a respective storage capacitor 500; that is, the access transistor 200 controls when a charge is applied to the storage capacitor 500, and when a charge is removed from the storage capacitor 500.

Figure 2:
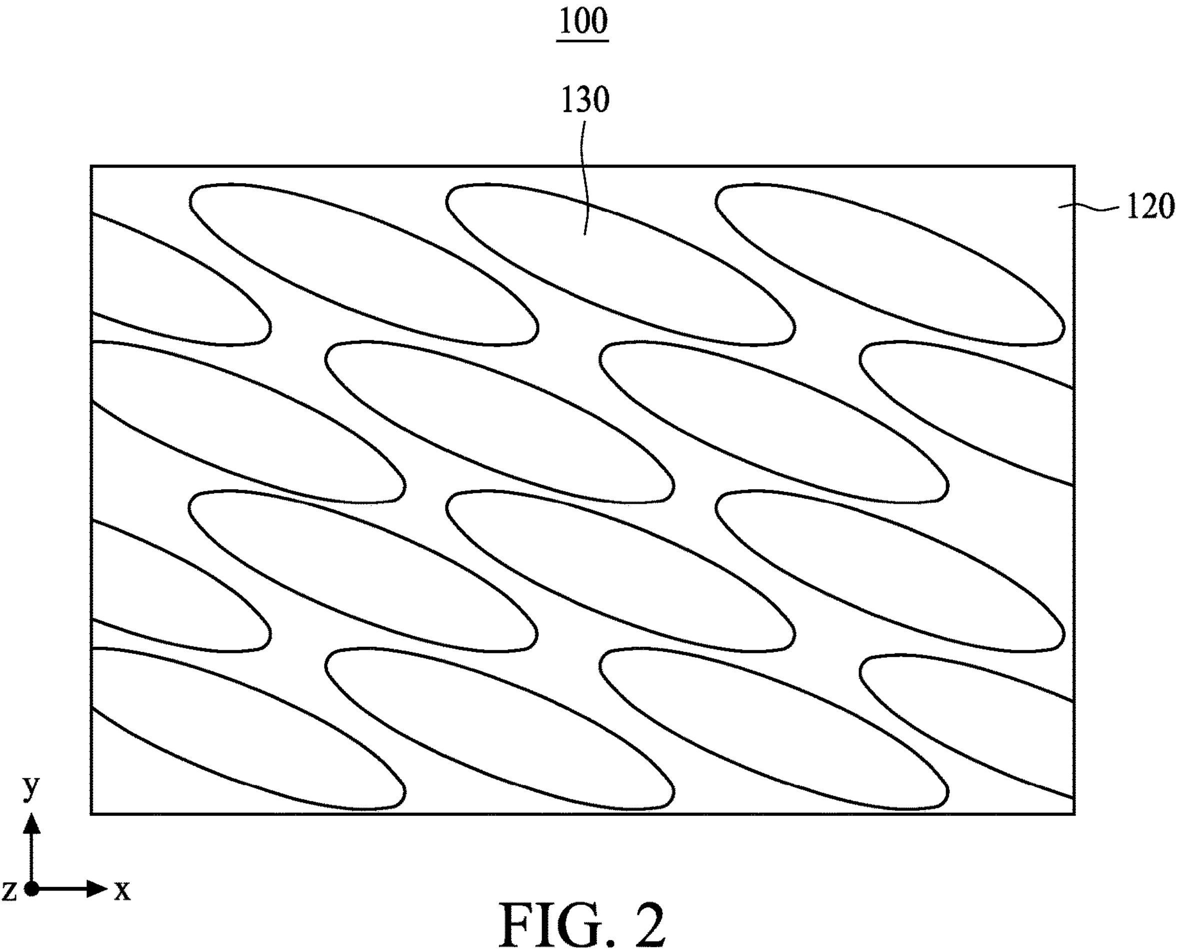
FIG. 2 is a plan view of a substrate in accordance with some embodiments of the present disclosure.

The access transistors 200 are formed in a substrate 100 having multiple isolation features 120 defining active regions 130. The active regions 130 may be elongated island-shaped regions, as shown in FIG. 2. For example, the active regions 130 can have an elliptical shape as viewed in the plan view in FIG. 2. In addition, the active regions 130 may be disposed such that major axes (along a longitudinal direction) of the active regions 130 are parallel to neither an x-axis nor a y-axis of an orthogonal coordinate system, wherein the x-axis is orthogonal to the y-axis.

The access transistors 200, in the active region 130, include a plurality of word lines 222 buried in the substrate 100 and covered by a capping layer 230, a plurality of gate insulators 212 disposed between the substrate 100 and the word lines 222, and a plurality of first impurity regions 240 and a second impurity region 250 disposed between sides of the word lines 222. The word lines 222, extending longitudinally along the y-axis and across the active regions 130, function as gates in the access transistors 200 through which they pass, and the bit line 350, extending longitudinally along the x-axis, functions as a signal for sources of the access transistors 200 to which it is electrically coupled.

The first impurity regions 240 and the second impurity regions 250 serve as drain and source regions of the access transistors 200. The first impurity regions 240 of the access transistor 200 are electrically coupled to the storage capacitor 500 by a plurality of first conductive features 324 electrically isolated by an insulative layer 310, while the second impurity region 250 of the access transistor 200 is electrically coupled to the bit line 350 by a second conductive feature 326. The semiconductor device 10 further includes an isolation layer 330 covering the storage capacitors 500; the second conductive feature 326 penetrates through the isolation layer 330 and the insulative layer 310 to electrically couple the bit line 350 on the isolation layer 330 to the access transistors 200.

According to comparative designs of the prior art, the first conductive features 324 are formed by depositing a conductive material in trenches defined in the insulative layer 310 utilizing a one-step deposition process, and the formation of the second conductive feature 326 is performed in a single deposition process, in which the conductive material is deposited in a trench defined in the insulative and isolation layers 310 and 330. During the one-step deposition process and the single deposition process, the conductive material is continuously deposited until a predetermined period of time has elapsed or a predetermined amount of the conductive material has been deposited.

Figure 3A:
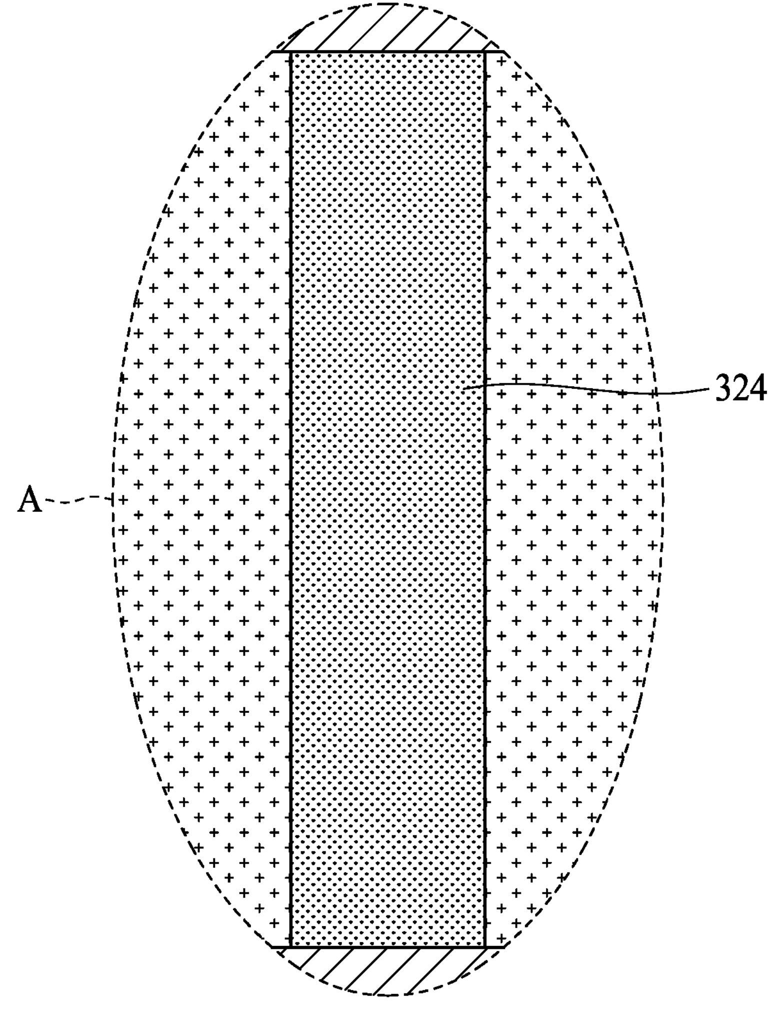
FIG. 3A is an enlarged view of an area A of FIG. 1.
Figure 3B:
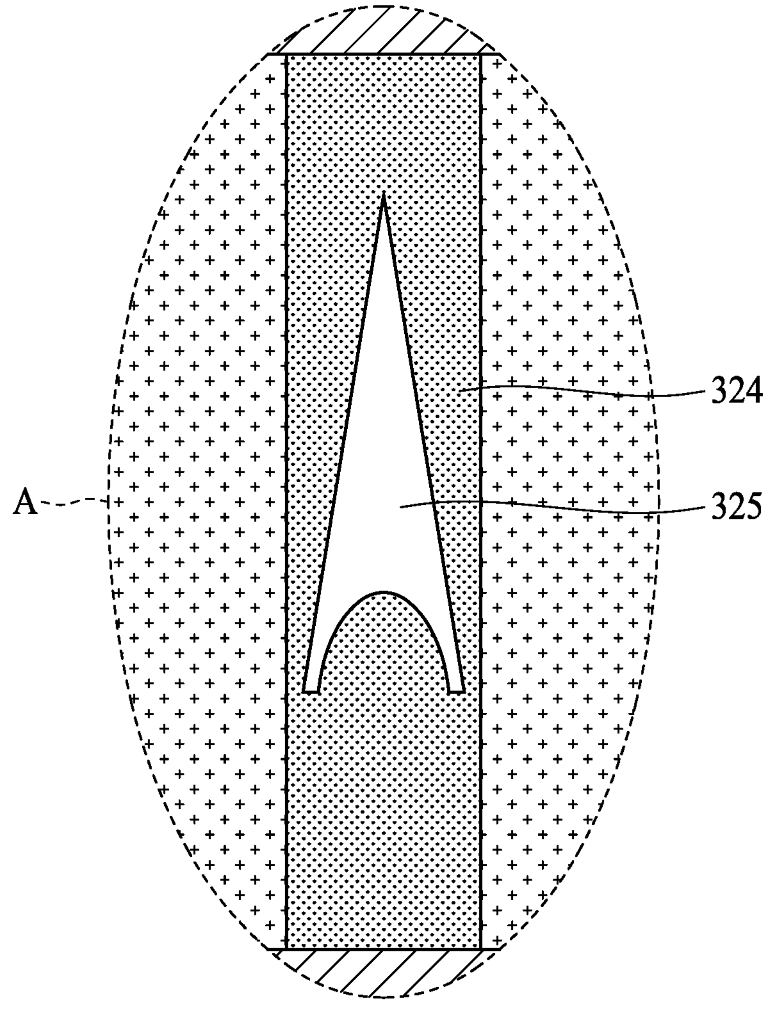
FIG. 3B is a cross-sectional view of a first conductive feature having a void.

It is typically desired that all of the first and second conductive features 324 and 326 be filled with the conductive material in a void-free manner, as shown in FIG. 3A. However, as device geometries are reduced, aspect ratios of the trenches for the formation of the first and second conductive features 324 and 326 increase. If the conductive material is still deposited in the high aspect ratio trenches using the one-step deposition, an undesirable void 325 may be formed in the first and second conductive features 324 and 326, as shown in FIG. 3B. The void 325 causes a resistance of the first or second conductive feature 324/326 to increase, thereby reducing the effectiveness of the first and second conductive features 324 and 326 in providing electrical communication and inhibiting performance of the semiconductor device 10. For such reason, the one-step deposition is no longer a suitable method for depositing the conductive material in the high aspect ratio trenches, and a new method of fabricating the semiconductor device 10 that includes forming the first and second conductive features 324 and 326 in the void-free manner is provided below.

Figure 4:
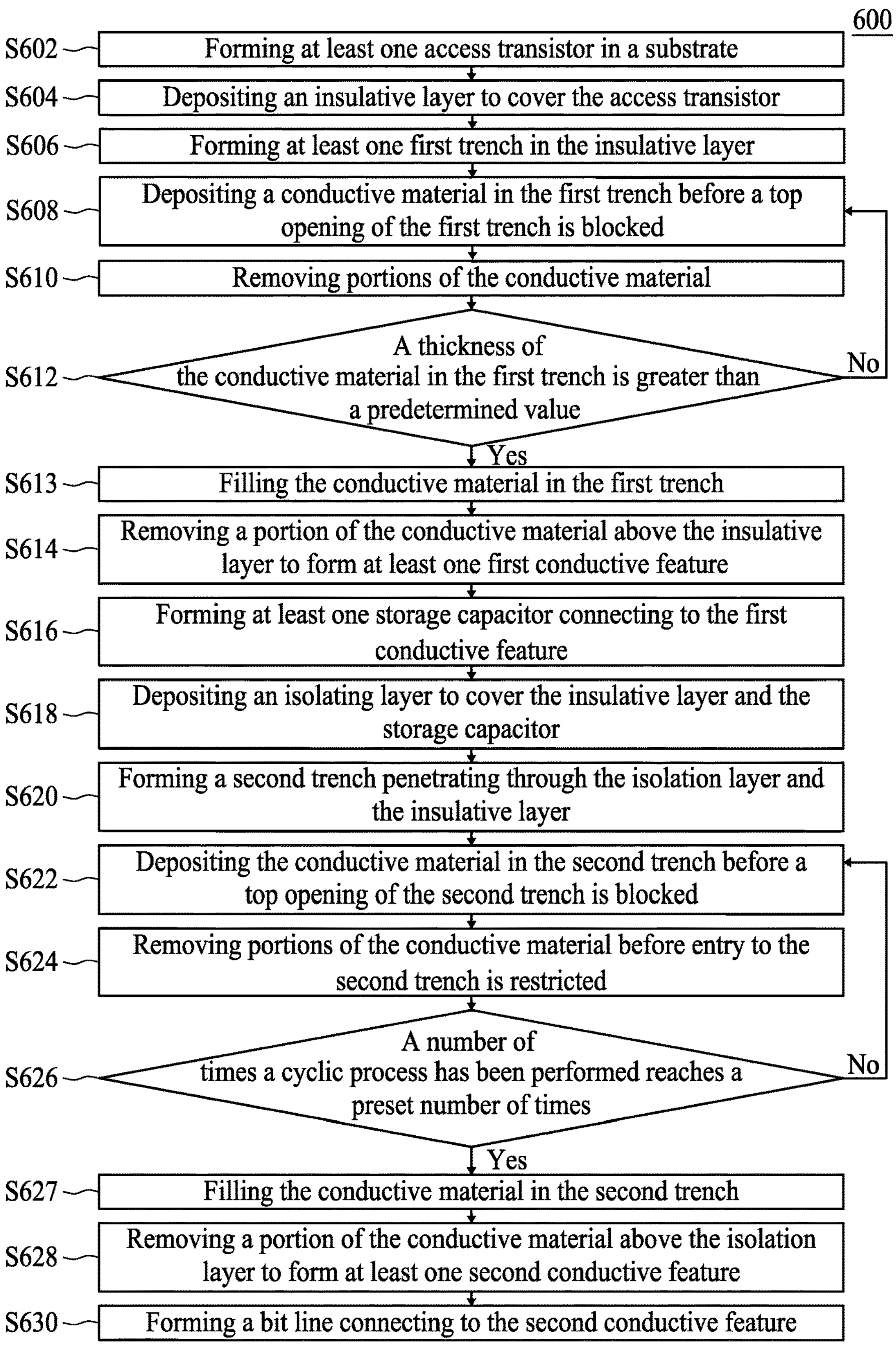
FIG. 4 is a flow diagram illustrating a method of fabricating a semiconductor device in accordance with some embodiments of the present disclosure.

FIG. 4 is a flow diagram illustrating a method 600 of manufacturing a semiconductor device 10 in accordance with some embodiment of the present disclosure. FIGS. 5 to 21 are schematic diagrams illustrating various fabrication stages constructed according to the method 600 for manufacturing the semiconductor device 10 in accordance with some embodiments of the present disclosure. The stages shown in FIGS. 5 to 21 are also illustrated schematically in the flow diagram in FIG. 4. In the subsequent discussion, the fabrication stages shown in FIGS. 5 to 21 are discussed in reference to the process steps shown in FIG. 4.

Figure 5:
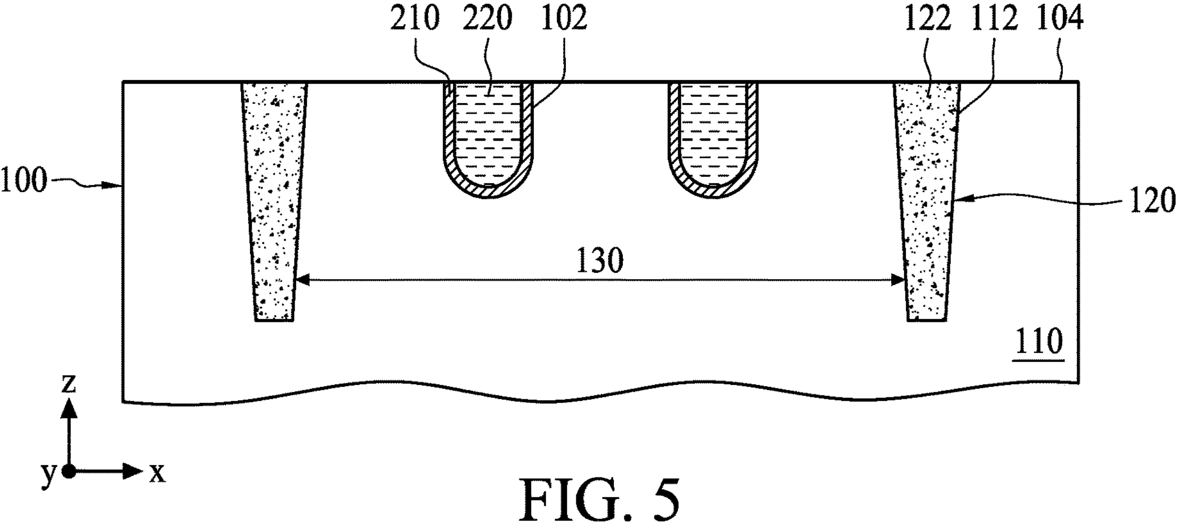
FIG. 5 through 21 illustrate cross-sectional views of intermediate stages in the formation of a semiconductor device in accordance with some embodiments of the present disclosure.
Figure 6:
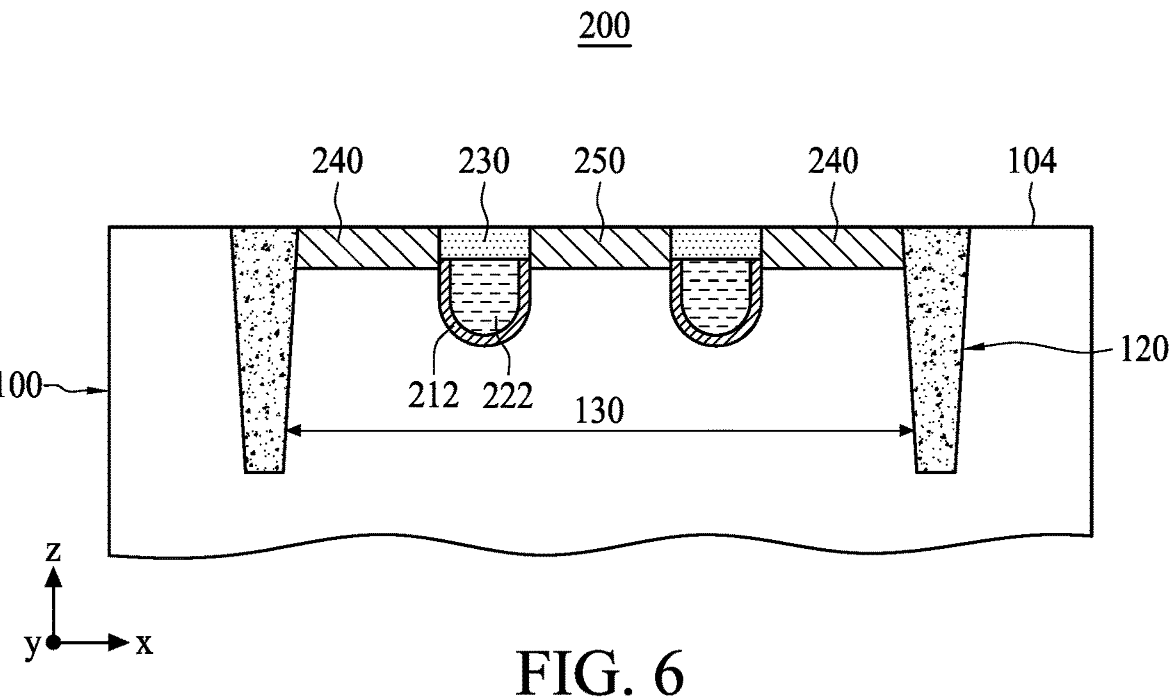

Referring to FIGS. 5 and 6, one or more access transistors 200 are formed in a substrate 100 according to a step S602 in FIG. 4. The substrate 100 includes a wafer 110 and one or more isolation features 120 formed in the wafer 110 to define active regions 130 in which the access transistors 200 are formed. The wafer 110 can be a bulk semiconductor, a semiconductor-on-insulator (SOI) substrate, a multi-layered or gradient substrate, or the like.

The formation of the isolation features 120 includes (1) forming one or more recesses 112 in the wafer 110 using suitable photolithography and etching processes to separate the active regions 130 from each other, (2) depositing a dielectric material 122, such as silicon oxide, in the recesses 112 using a high density plasma chemical vapor deposition (CVD) process, for example, until the dielectric material 122 completely fills the recesses 112, and (3) performing a planarization process to remove excess dielectric material 122 above the wafer 110. The planarization of the dielectric material 122 over the recesses 112 can be accomplished by, for example, a chemical mechanical polishing (CMP) process.

Subsequently, portions of the substrate 100 are etched away to form multiple grooves 102 crossing the active regions 130. The grooves 102 may be formed to be parallel to a y-axis of an orthogonal coordinate system. In addition, each of the active regions 130 may be divided into three regions by a pair of grooves 102 intersecting the active region 130. In some embodiments, bottoms of the grooves 102 may be rounded to reduce defect density and lower electric field concentration during operation of the semiconductor device 10.

After the formation of the grooves 102, a gate dielectric material 210 and a gate material 220 are sequentially deposited in the grooves 102, and a planarization process is then performed to remove portions of the gate dielectric material 210 and the gate material 220 above an upper surface 104 of the semiconductor wafer 100. The gate dielectric material 210, including oxide, nitride, oxynitride or high-k material, covers an exposed portion of the substrate 100, but does not completely fill the groove 102. The gate dielectric material 210, having a substantially uniform thickness, can be deposited using a CVD process, an atomic layer deposition (ALD) process, or the like. The gate material 220, including polysilicon, is deposited on the gate dielectric material 210 until the grooves 102 are entirely filled using a CVD process, a physical vapor deposition (PVD) process, an ALD process or another suitable process. In some embodiments, the polysilicon is undoped. The removal of the portions of the gate dielectric material 210 and the gate material 220 overflowing the grooves 102 can be implemented using an etching process and/or a polishing process.

Next, the gate material 220 is recessed below the upper surface 104 of the substrate 100, as shown in FIG. 6. Consequently, a plurality of word lines 222 are formed. In some embodiments, the gate dielectric material 210 can be optionally recessed below the upper surface 104 of the substrate 100 to thus form gate insulator 212.

After the formation of the gate insulator 212 and the word lines 222, a capping layer 230 is deposited in the grooves 102 to bury the gate insulator 212 and the word lines 222. The capping layer 230 may include silicon oxide, silicon nitride, silicon oxynitride, hafnium dioxide or zirconium dioxide, for example. Subsequently, dopants are introduced into the substrate 100 to form a plurality of first impurity regions 240 and a second impurity region 250 between sides of the word lines 222. Accordingly, the (recessed) access transistors 200 are completely formed.

Figure 7:
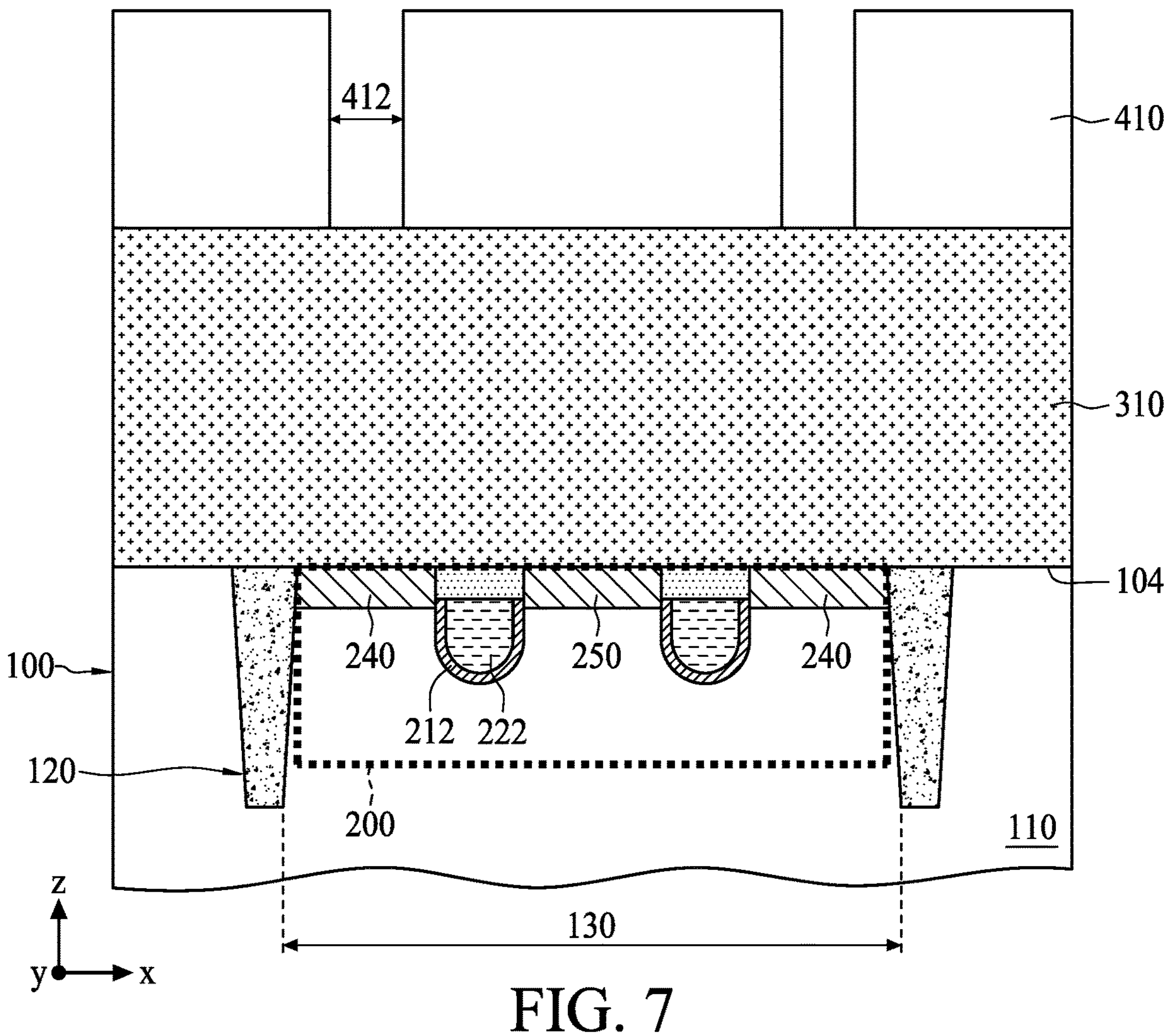

Referring to FIG. 7, an insulative layer 310 is deposited to cover the access transistor 200 according to a step S604 in FIG. 4. The insulative layer 310 can be formed by uniformly depositing a dielectric material, using a CVD process, to cover the upper surface 104 of the substrate 100 and the access transistors 200. Alternatively, the insulative layer 310 may be formed on the substrate 100 and the access transistors 200 using a spin-coating process. The insulative layer 310 may be planarized, using, for example, a CMP process, to yield an acceptably flat topology. The flat topology permits patterning first trenches, as will be described below, with lithography equipment having a reduced depth of field. The insulative layer 310 can include oxide, tetraethylorthosilicate (TEOS), undoped silicate glass (USG), phosphosilicate glass (PSG), borosilicate glass (BSG), borophosphosilicate glass (BPSG), fluoride silicate glass (FSG), spin-on glass (SOG), tonen silazene (TOSZ), or combinations thereof Subsequently, a first pattern mask 410, including multiple windows 412, is formed by steps including (1) conformally coating a photosensitive material on the insulative layer 310, (2) exposing portions of the photosensitive material to radiation (not shown), and (3) developing the photosensitive material, thereby forming the windows 412 defining a pattern to etch through the insulative layer 310.

Figure 8:
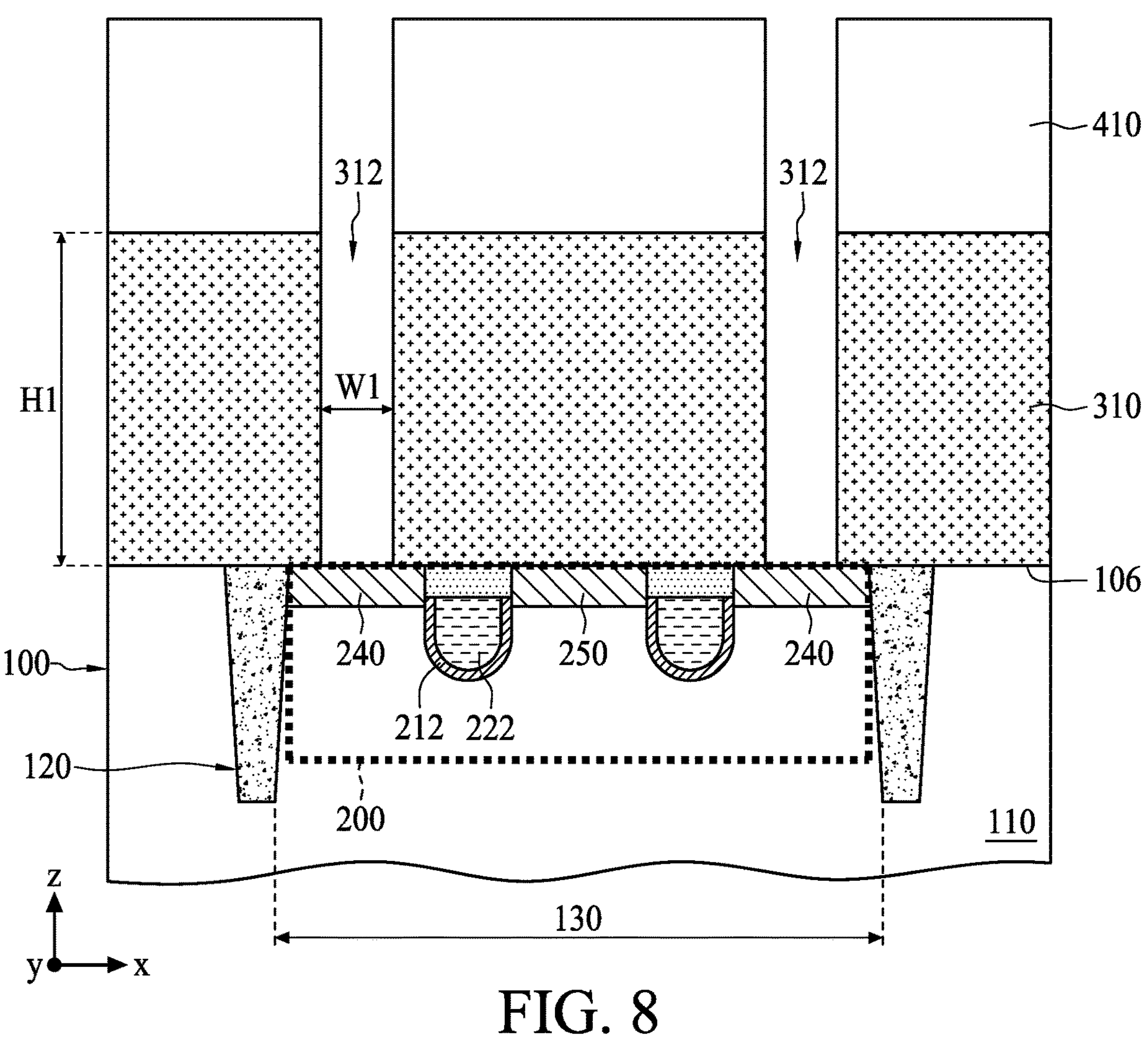

Referring to FIG. 8, an etching process is performed to remove portions of the insulative layer 310 not protected by the pattern mask 410 according to a step S606 in FIG. 4. Consequently, a plurality of first trenches 312 are formed. After the etching process, portions of the first impurity regions 240 are exposed. The insulative layer 310 is etched using a reactive ion etching (RIE) process, for example.

The first trenches 312, penetrating through the insulative layer 310, have a width W1 and a height H1. In addition, the first trenches 312 have an aspect ratio, (i.e., the height H1 divided by the width W1), of about 5 or greater. In some embodiments, the aspect ratio of each first trench 312 is in a range of between 6 and 8. After the formation of the first trenches 312, the pattern mask 410 is removed using an ashing process or a wet strip process, wherein the wet strip process may chemically alter the pattern mask 410 so that it no longer adheres to the insulative layer 310.

Subsequently, a cyclic process of alternating a deposition step and a removal step is performed to deposit a conductive material 320 in the first trenches 312. The deposition step is conducted to deposit the conductive material 320 in the first trenches 312 using, for example, a low-pressure CVD process, and the removal step is conducted to remove portions of previously deposited conductive material 320 from regions where deposition is not desirable but could not have been avoided. In some embodiments, doped polysilicon is used as the conductive material 320.

Figure 9:
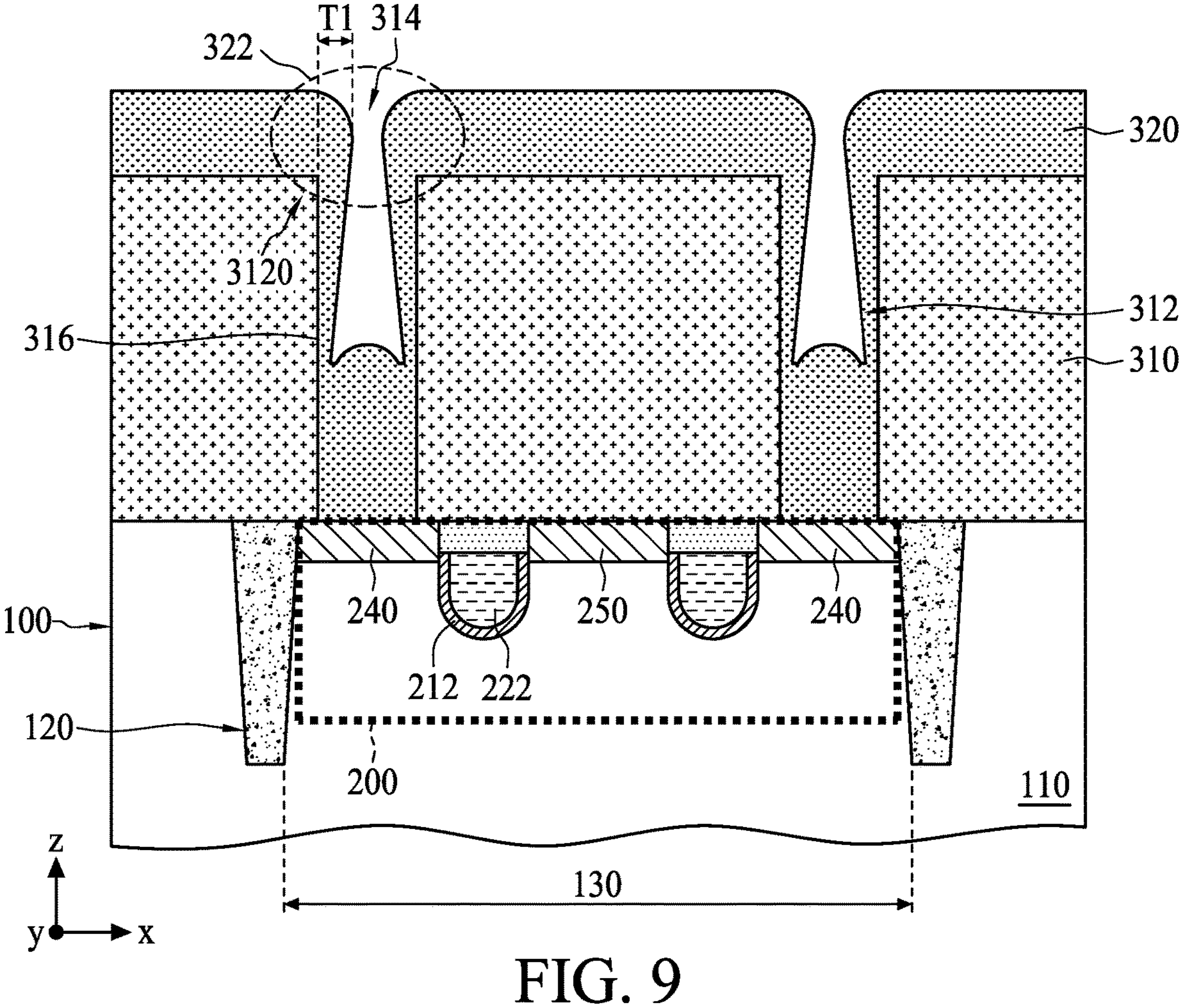

The cyclic process is illustrated starting in FIG. 9. Referring to FIG. 9, according to a step S608 in FIG. 4, the conductive material 320 is deposited in the first trenches 312 before top openings of the first trenches 312 are blocked. Typically, the conductive material 320 is omni-directionally deposited on exposed surfaces of the insulative layer 310 and the first impurity regions 240; however, due to the greatest arriving angle of the conductive material 320 is at the upper corner 3120 of the insulative layer 310, an excessive overhang 322 is formed at an upper end 314 of each first trench 312 before the conductive material 320 completely fills the first trench 312. The overhangs 322 are shown as portions of a layer of the conductive material 320 at the upper ends 314 of the first trenches 312 which are thicker than other portions of the layer of the conductive material 320 due to greater deposition at locations on the upper ends 314 of the first trenches 312. As the overhangs 322 continue to accumulate material, the top openings of the first trenches 312 become narrowed, and the upper ends 314 of the first trenches 312 may be blocked before a bottom-up fill has been completed, leaving voids within a finished product, as shown in FIG. 3B.

In order to prevent the voids from being present in the finished product, the deposition step is terminated when a thickness T1 (e.g., an upper or maximum thickness) of one of the overhangs 322 reaches one quarter of the width W1 (the width W1 is shown in FIG. 8) of the first trenches 312. The thickness T1 of the overhangs 322 may be monitored by using a thickness monitor (not shown) positioned proximate to or inside a chamber in which the deposition of the conductive material 320 is performed. In some embodiments, the thickness monitor may dynamically monitor the thickness T1 of the overhangs 322 and is configured to terminate the deposition of the conductive material 320 if the thickness T1 of one of the overhangs 322 is equal to one quarter of the width W1 of the first trenches 312. In some embodiments, the thickness monitor may use optical monitoring techniques to detect the temporal evolution of light transmitted, scattered and/or reflected from the layer of the conductive material 320 to measure the thickness T1 of the overhangs 322.

Figure 10:
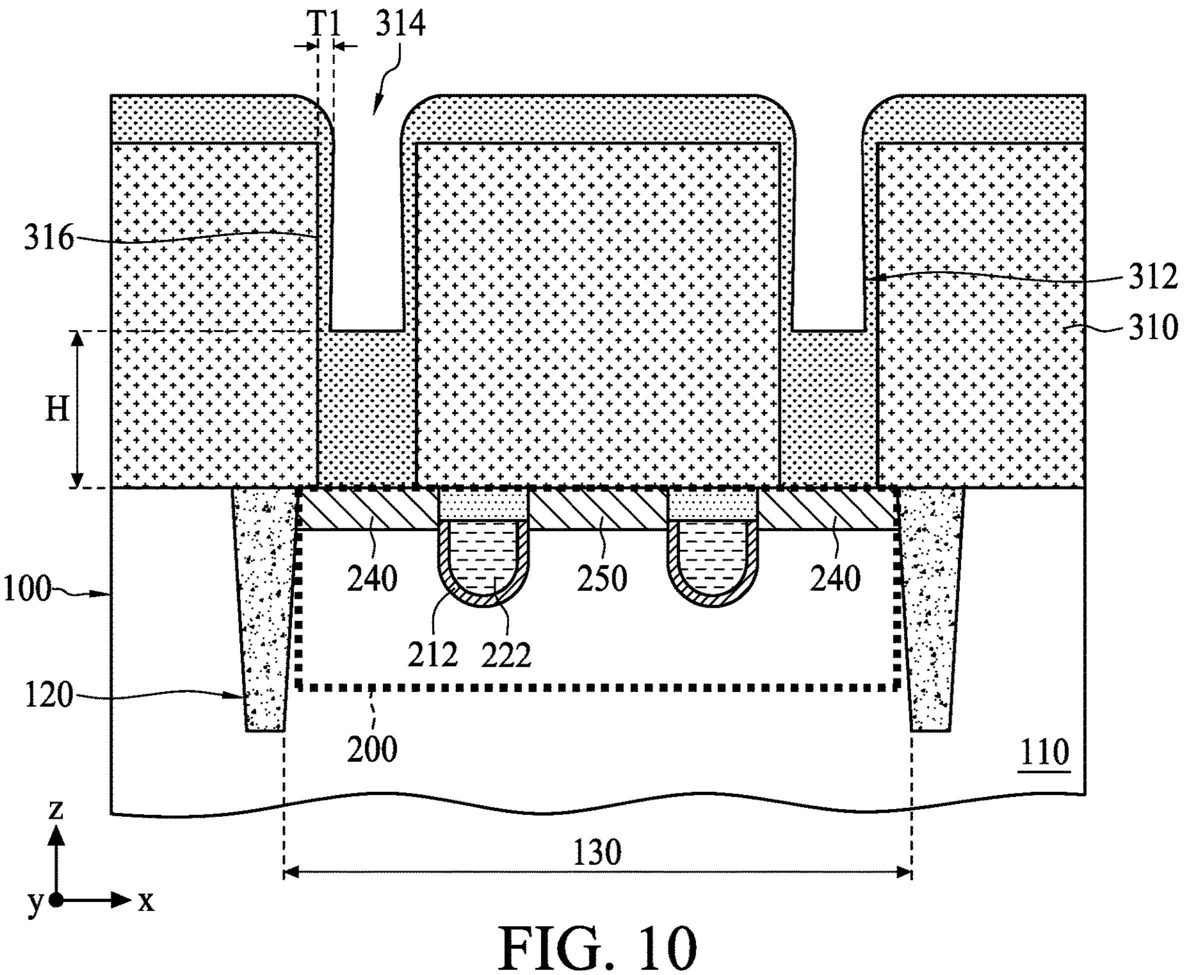

Referring to FIG. 10, the removal step is subsequently conducted to trim the overhangs 322 according to a step S610 in FIG. 4. The overhangs 322 are trimmed to reduce the constrictions at the upper ends 314 of the first trenches 312. Notably, during the removal step, not only are portions of the conductive material 320 at the upper ends 314 of the first trenches 312 removed, but portions of the conductive material 320 in lower portions of the first trenches 312 are also removed during the removal step. In some embodiments, after the removal step is completed, portions of the conductive material 320 coated on sidewalls 316 of the insulative layer 320 can have a substantially uniform thickness, wherein the sidewall 316 of the insulative layer 320 interfaces with the first trenches 312. In addition, the conductive material 320 on bottoms of the first trenches 312 may have a relatively flat topology. The removal step is, for example, a wet ashing process, a wet etching process or the like.

After the removal step is completed, the method 600 proceeds to a step S612, in which it is determined whether a height Hof the conductive material 320 in the first trenches 312 is greater than a predetermined height. The predetermined height may be computed or simulated from a parameterized mathematical model or may be found using trial-and-error tests to ensure that the top openings of the first trenches 312 are not blocked before the bottom-up fill has been completed. In some embodiments, the predetermined height is, for example, equal to one half of the height H1 of the first trenches 312 (the height H1 is shown in FIG. 8). The height H of the conductive material 320 in the first trenches 312 can be measured using the thickness monitor positioned proximate to or inside the chamber in which the deposition of the conductive material 320 is performed. Alternatively, the height H of the conductive material 320 may be measured ex-situ from the deposition of the conductive material 320.

Figure 11:
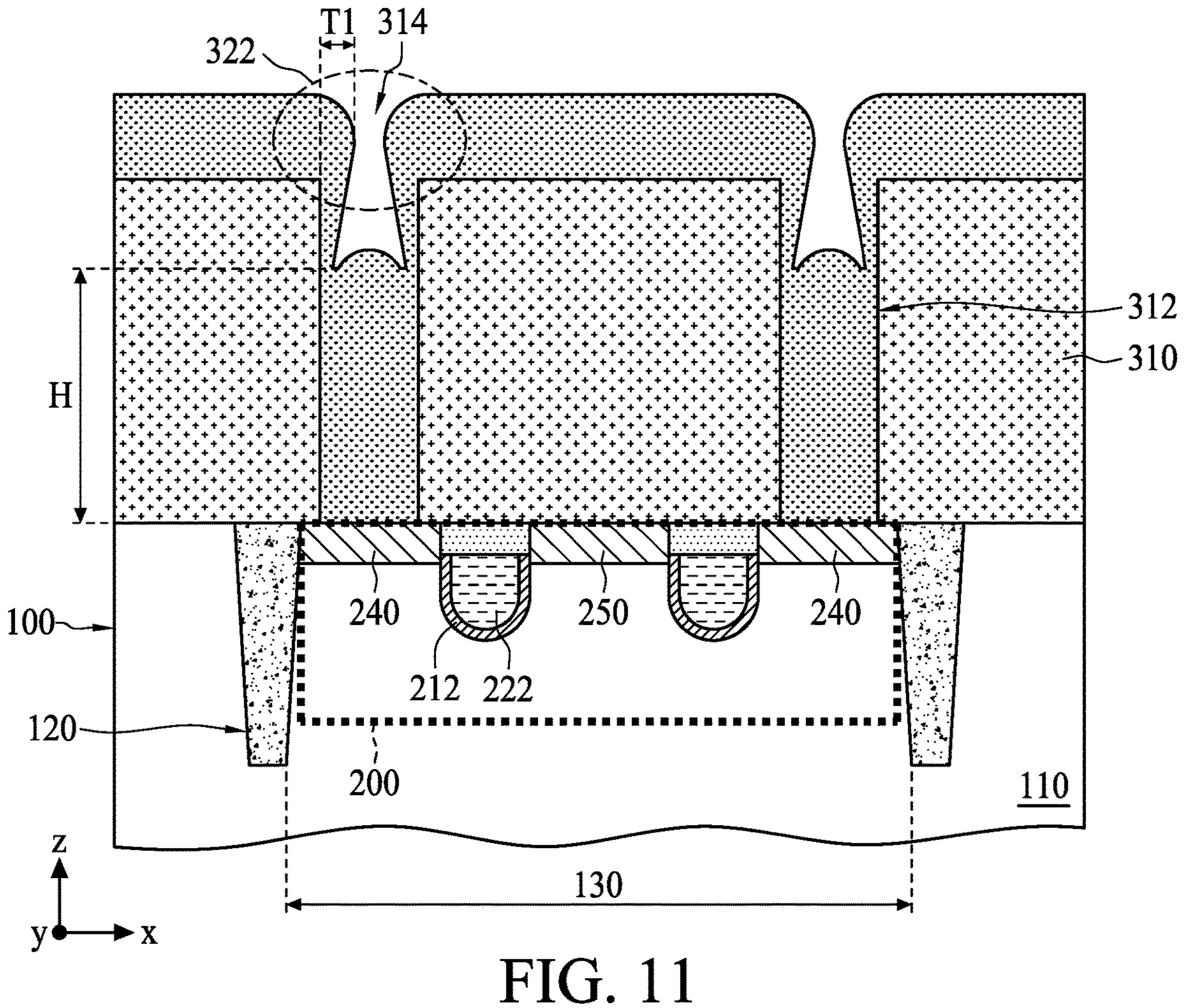

In the step S612, if the height H of the conductive material 320 in the first trenches 312 is less than or equal to the predetermined height, the method 600 repeats the step S608 of deposition of the conductive material 320 and the step S610 of removal of portions of the conductive material 320. During the deposition step, the conductive material 320 is conformally deposited over the insulative layer 310 and in the first trenches 312, as shown in FIG. 11; accordingly, the thickness T1 of the overhangs 322 as well as the height H of the conductive material 320 in the first trenches 312 both increase. When the thickness T1 of the overhangs 322 is equal to one quarter of the width W1 of the first trenches 312 (the width W1 is shown in FIG. 8), the deposition step is terminated.

Figure 12:
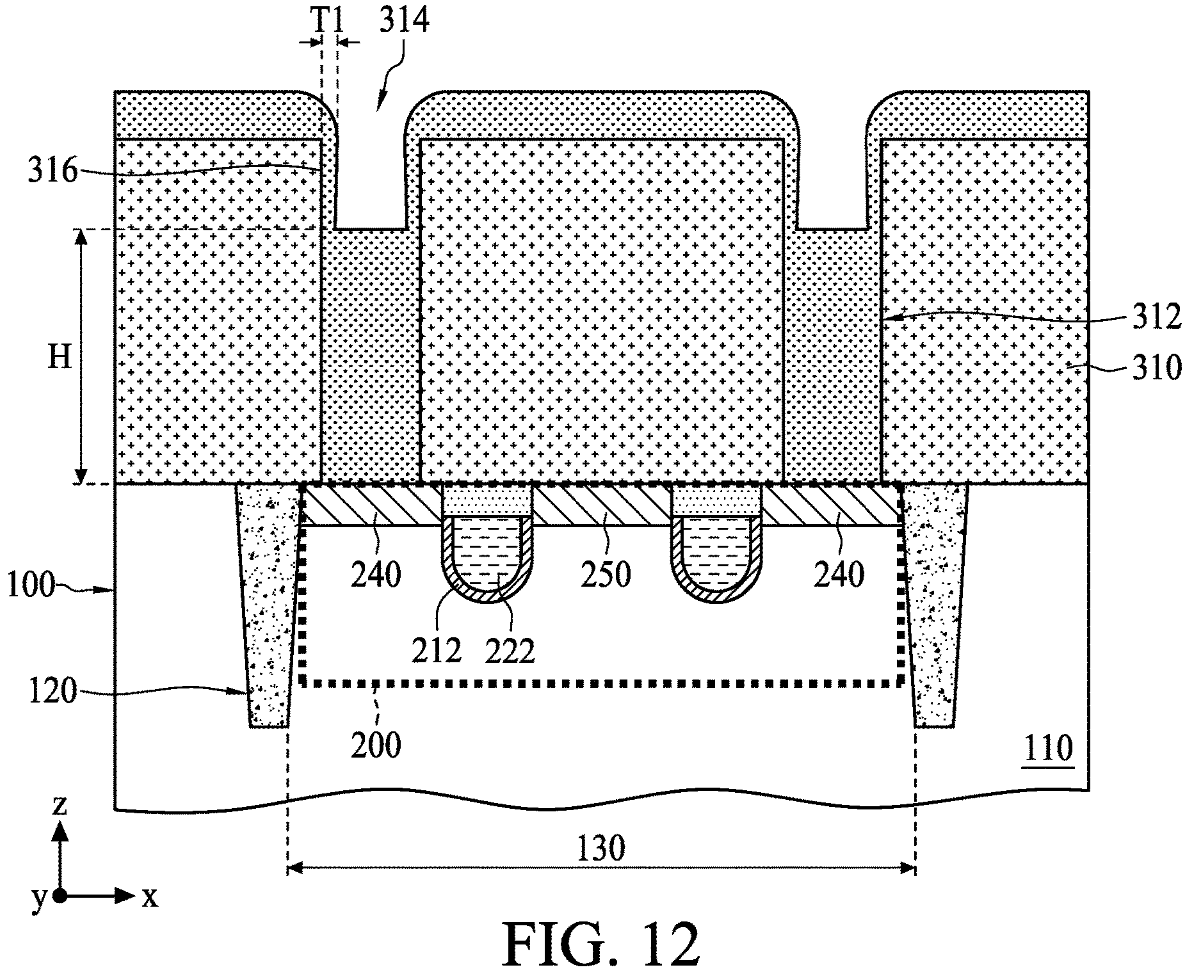

Referring to FIG. 12; during the removal step, the previously deposited conductive material 320 is, for example, processed under isotropic conditions. That is, the removal step removes the conductive material 320 isotropically from the first trenches 312 resulting in widening of the first trenches 312, thus reducing the aspect ratio of the partially-filled first trenches 312, and facilitating further filling of the first trenches 312 by subsequent deposition.

Figure 13:
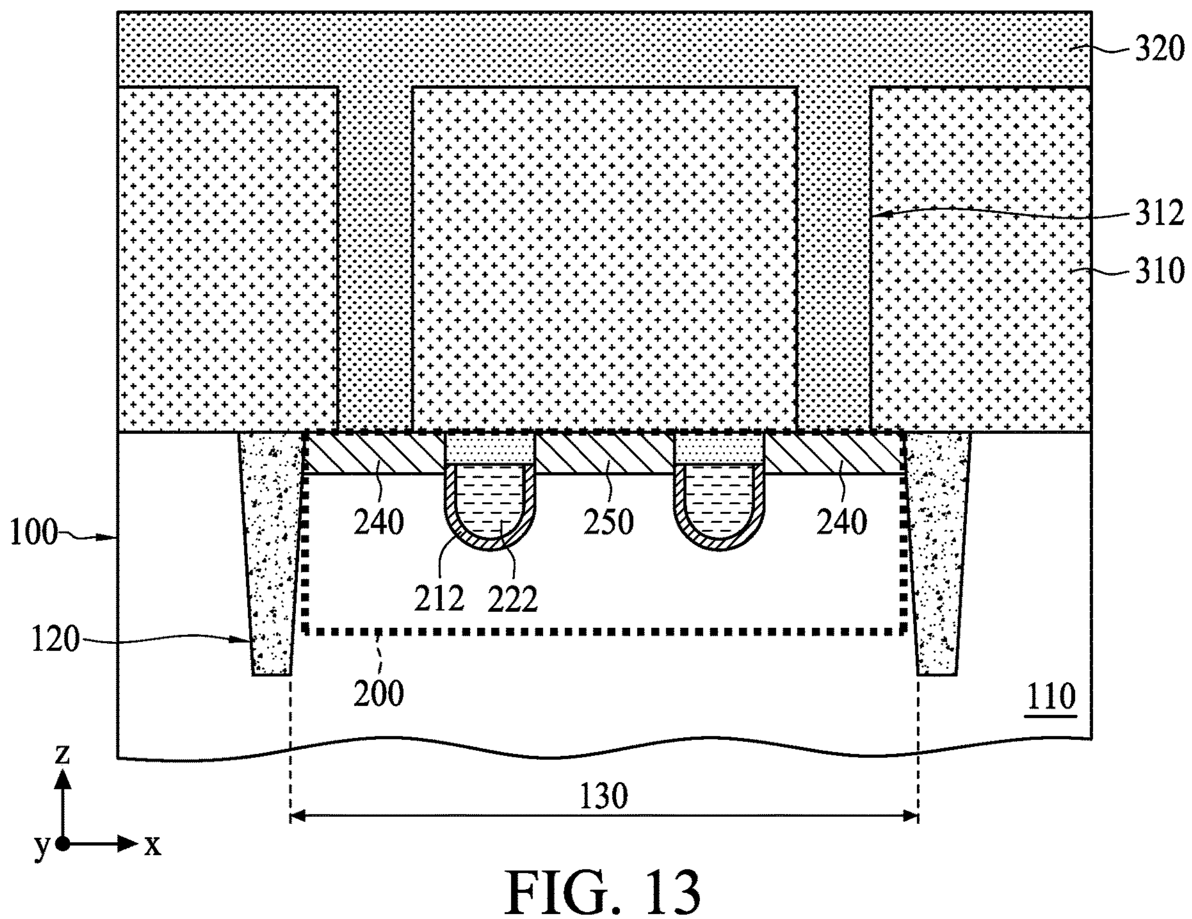

In the step S612, if the height H of the conductive material 320 in the first trenches 312 is greater than the predetermined height, the method 600 precedes to the step S613, in which a final deposition process is performed to fill the first trenches 312 with the conductive material 320, as shown in FIG. 13.

Figure 14:
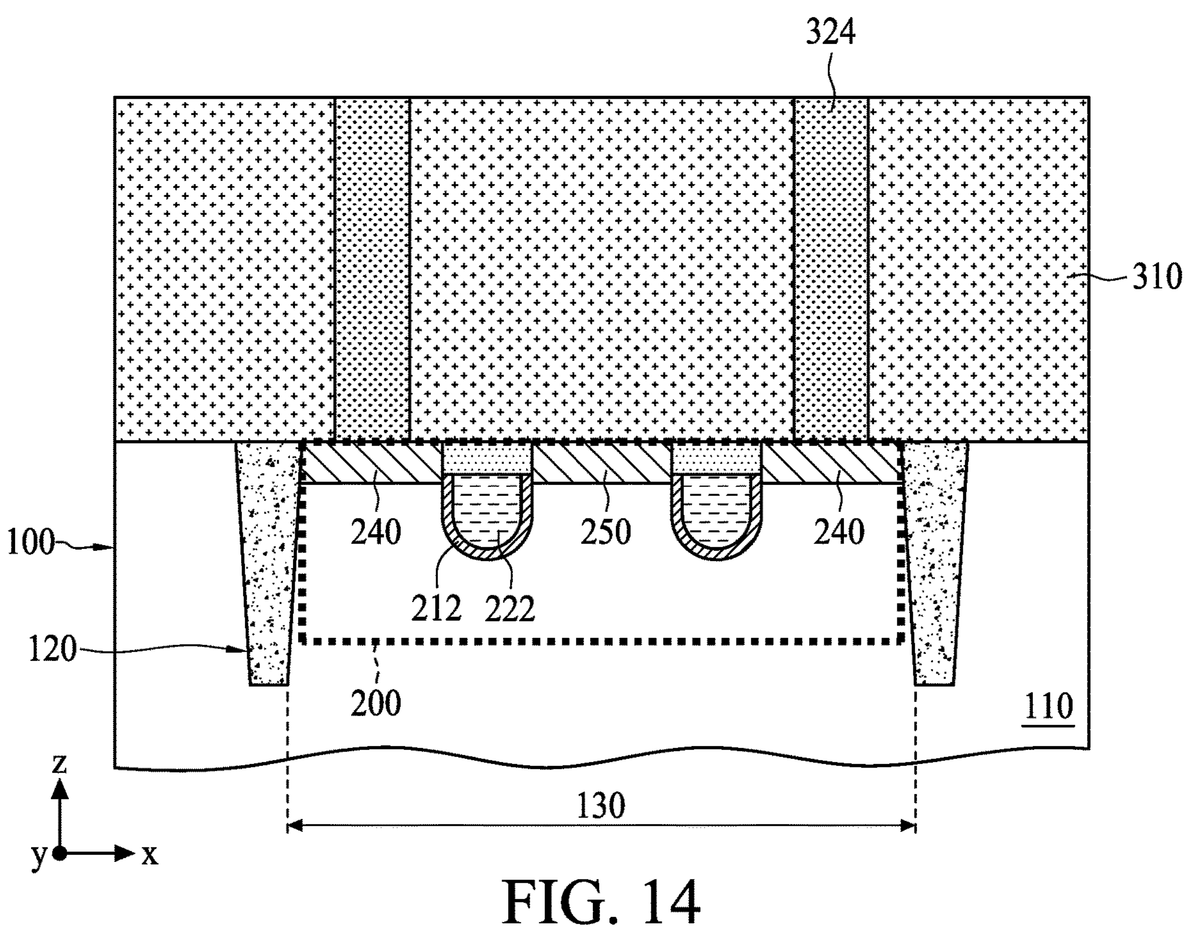

According to a step S614, after the final deposition process, a polishing process is performed to remove a portion of the conductive material 320 overflowing the first trenches 312, as shown in FIG. 14. Consequently, a plurality of first conductive features 322 are formed in a void-free manner. The polishing process can include a CMP process and/or a wet etching process.

Figure 15:
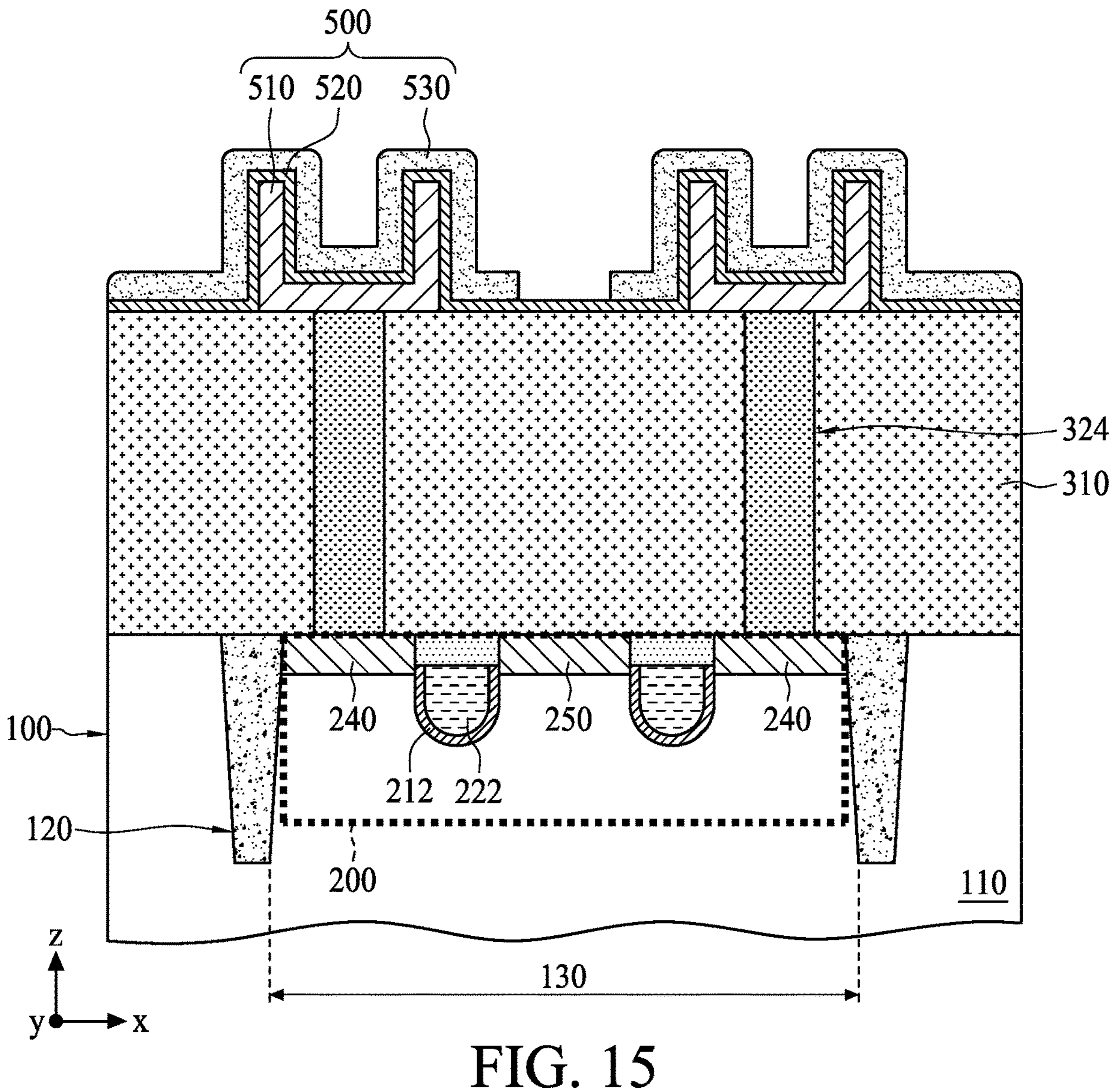

Referring to FIG. 15, a plurality of storage capacitors 500 are formed on the insulative layer 310 and the first conductive features 324 according to a step S616 in FIG. 4. The fabrication of the storage capacitors 500 involves sequentially forming a plurality of storage nodes 510 on the insulative layer 310 and in contact with the first conductive features 322, depositing a capacitor insulator 520 to cover the insulative layer 310 and the storage nodes 510, and depositing a top electrode 530 on the capacitor insulator 520. In some embodiments, a portion of the top electrode 530 above the second impurity region 250 is removed for the formation of a second conductive feature, as will be described below.

The storage nodes 510 are in a U-shaped configuration and function as lower electrodes of the storage capacitor 500. The storage nodes 510 may be formed of doped polysilicon or metal such as titanium nitride (TiN) or ruthenium (Ru). The capacitor insulator 520 can have a topology following the topology of the storage nodes 510 and the insulative layer 310. The capacitor insulator 520 may include silicon dioxide ($SiO_2$), silicon nitride ($Si_3N_4$), or high-k materials such as zirconium oxide ($Zr_2O_2$), hafnium oxide ($HfO_2$), titanium oxide ($TiO_2$), or aluminum oxide ($Al_2O_2$). In some embodiments, the capacitor insulator 520 may be formed of either a double film of nitride/oxide film or a triple film of oxide/nitride/oxide. The top electrode 530 may be a substantially conformal layer and may be formed by a CVD process. The top electrode 530 may be formed of low-resistivity material, such as titanium nitride or combinations of titanium nitride, tantalum nitride (TaN), tungsten nitride (WN), ruthenium, iridium (Ir), and platinum (Pt).

Figure 16:
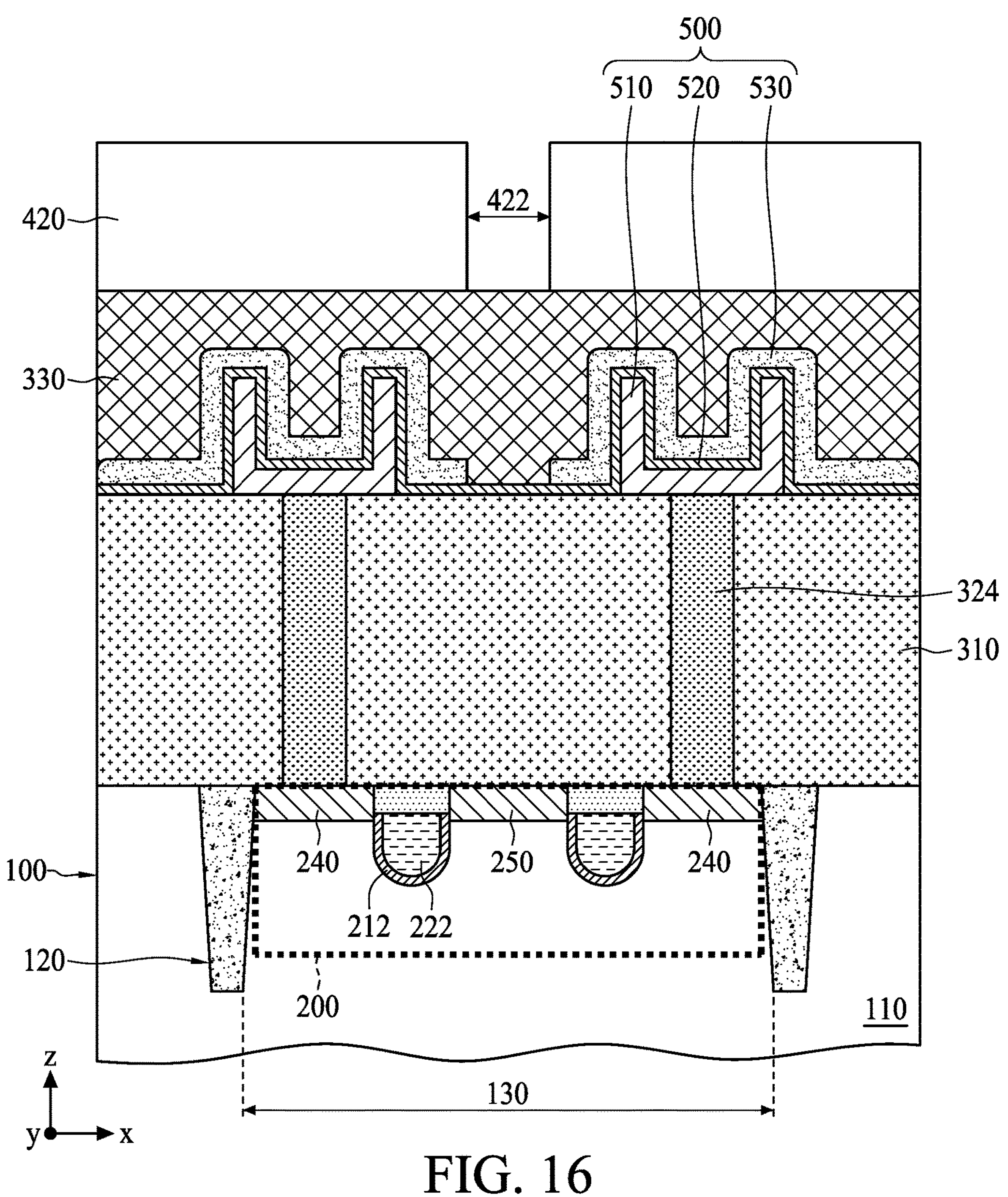

Referring to FIG. 16, an isolation layer 330 is deposited to cover the storage capacitors 500 according to a step S618 in FIG. 4. The isolation layer 330 can be formed by uniformly depositing a dielectric material using a CVD process or a spin-coating process. The isolation layer 330 may be planarized, using, for example, a CMP process, to yield an acceptably flat topology. In some embodiments, the isolation layer 330 for protecting the storage capacitors 500 may include dielectric material, such as TEOS.

Subsequently, a photoresist layer is applied over the entire isolation layer 330 by a spin-coating process and then dried using a soft-baking process. The photoresist layer, including photosensitive material, is exposed and developed to form a second pattern mask 420 including at least one window 422. A portion of the isolation layer 330 above the second impurity region 250 is exposed to the window 422.

Figure 17:
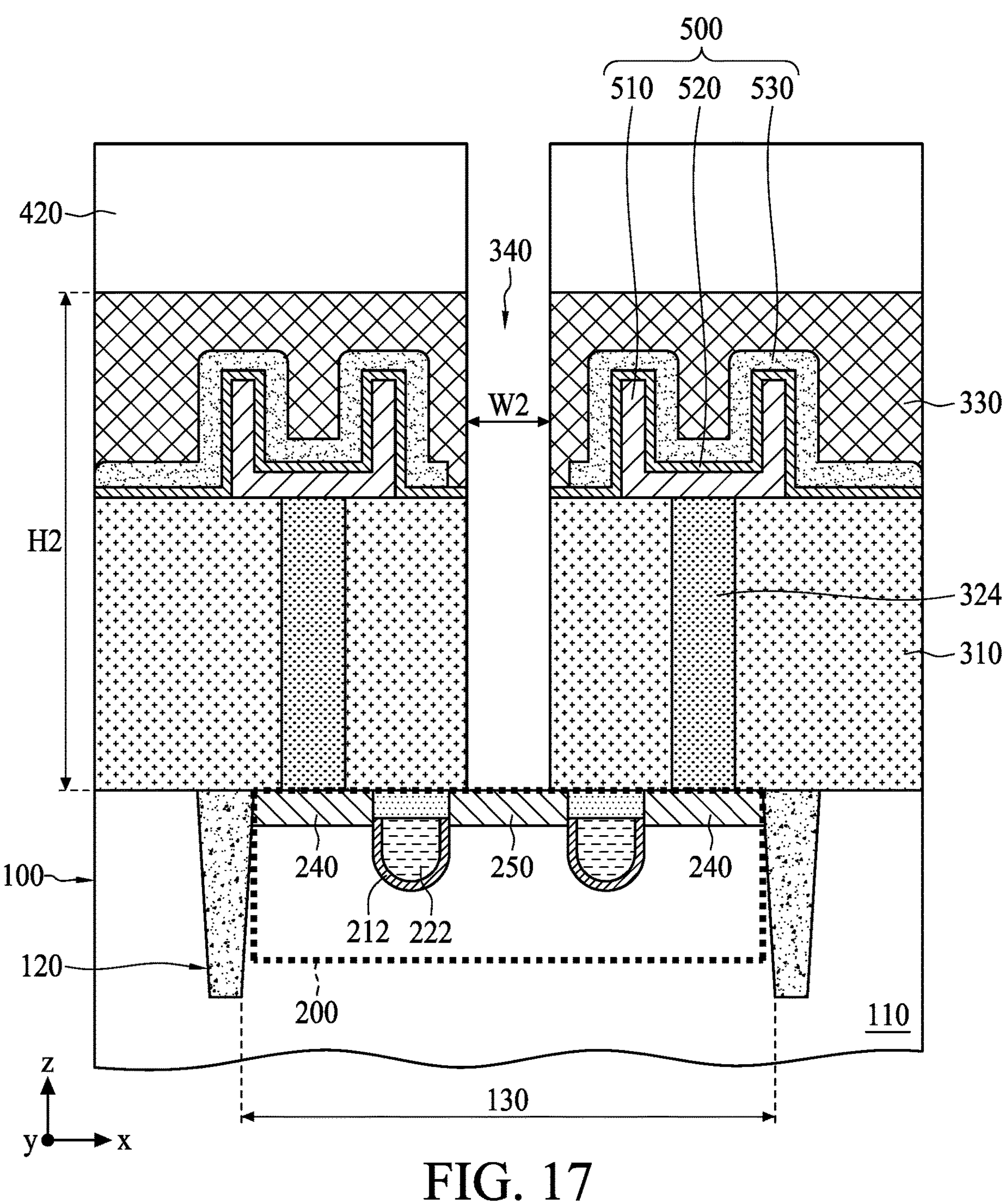
Figure 18:
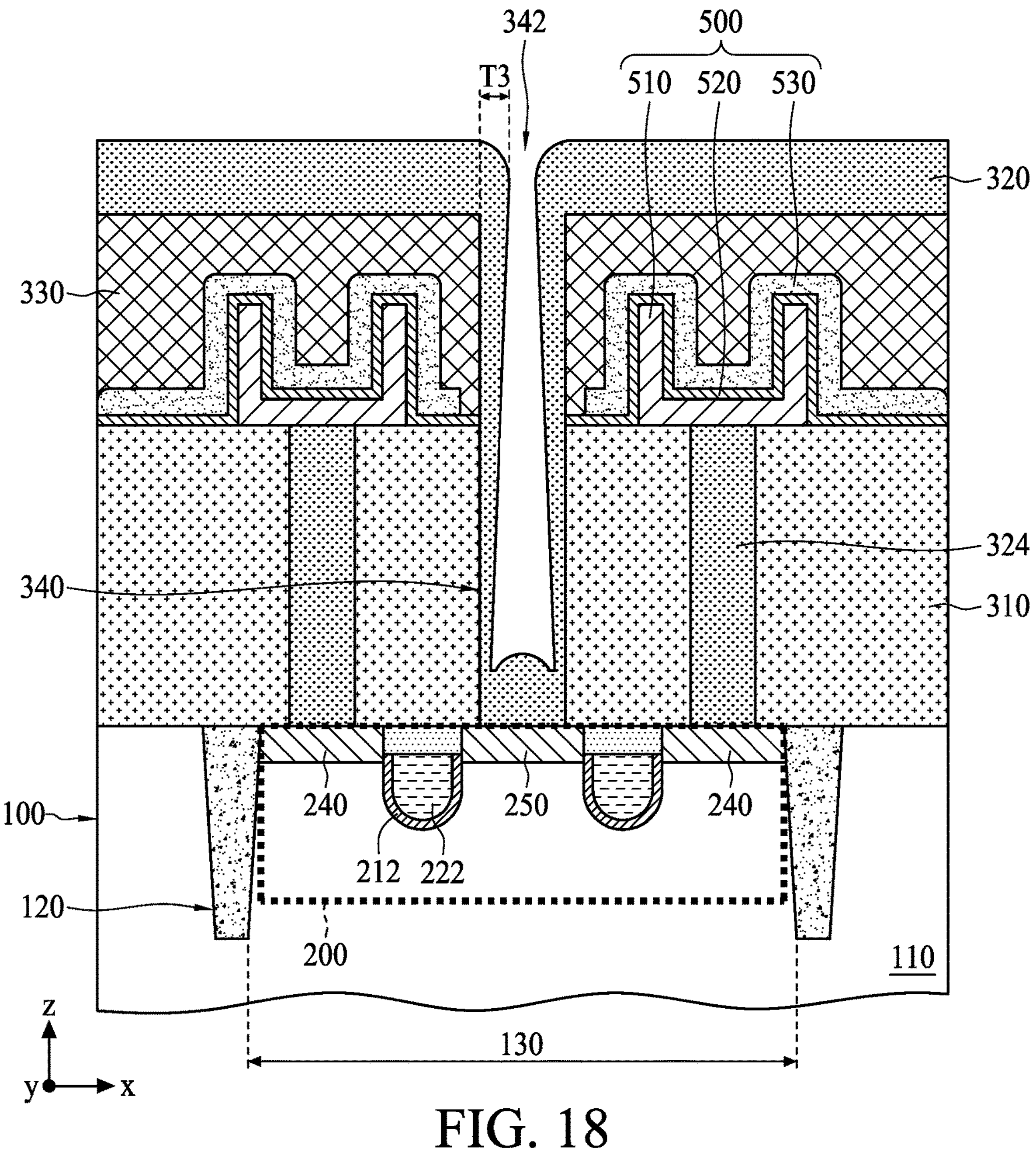

Referring to FIG. 17, at least one etching process is performed to remove portions of the isolation layer 330, the capacitor insulator 520 and the insulative layer 310 not protected by the second pattern mask 420 according to a step S620 in FIG. 4. Consequently, at least one second trench 340 is formed, and a portion of the second impurity region 250 is exposed. The second trench 340, penetrating through the insulative layer 310, the isolation layer 330 and the capacitor insulator 520, can be formed using an etching process utilizing multiple etchants, selected based on the materials of the insulative layer 310, the isolation layer 330 and the capacitor insulator 520, to sequentially etch the isolation layer 330, the capacitor insulator 520 and the insulative layer 310 until the second impurity region 250 is exposed.

The second trench 340 has a width W2 and a height H2. In addition, the second trench 340 has an aspect ratio, (i.e., the height H2 divided by the width W2), of about 5 or greater. In some embodiments, the aspect ratio of the second trench 340 is in a range of between 6 and 8. It is observed that the aspect ratio of the first trenches 312 (shown in FIG. 8) is less than that of the second trenches 340. After the formation of the second trench 340, the second pattern mask 420 is removed using an ashing process or a wet strip process.

The method then proceeds to a step S622 to deposit the conductive material 320 in the second trench 340 before a top opening of the second trench 340 is blocked. In detail, the conductive material is deposited using a low-pressure CVD on the isolation layer 330 and in the second trench 340 until a thickness T3 of an excessive overhang 322 at an upper end 342 of the second trench 340 reaches one quarter of the width W2 of the second trenches 340 (the width W2 is shown in FIG. 17).

Figure 19:
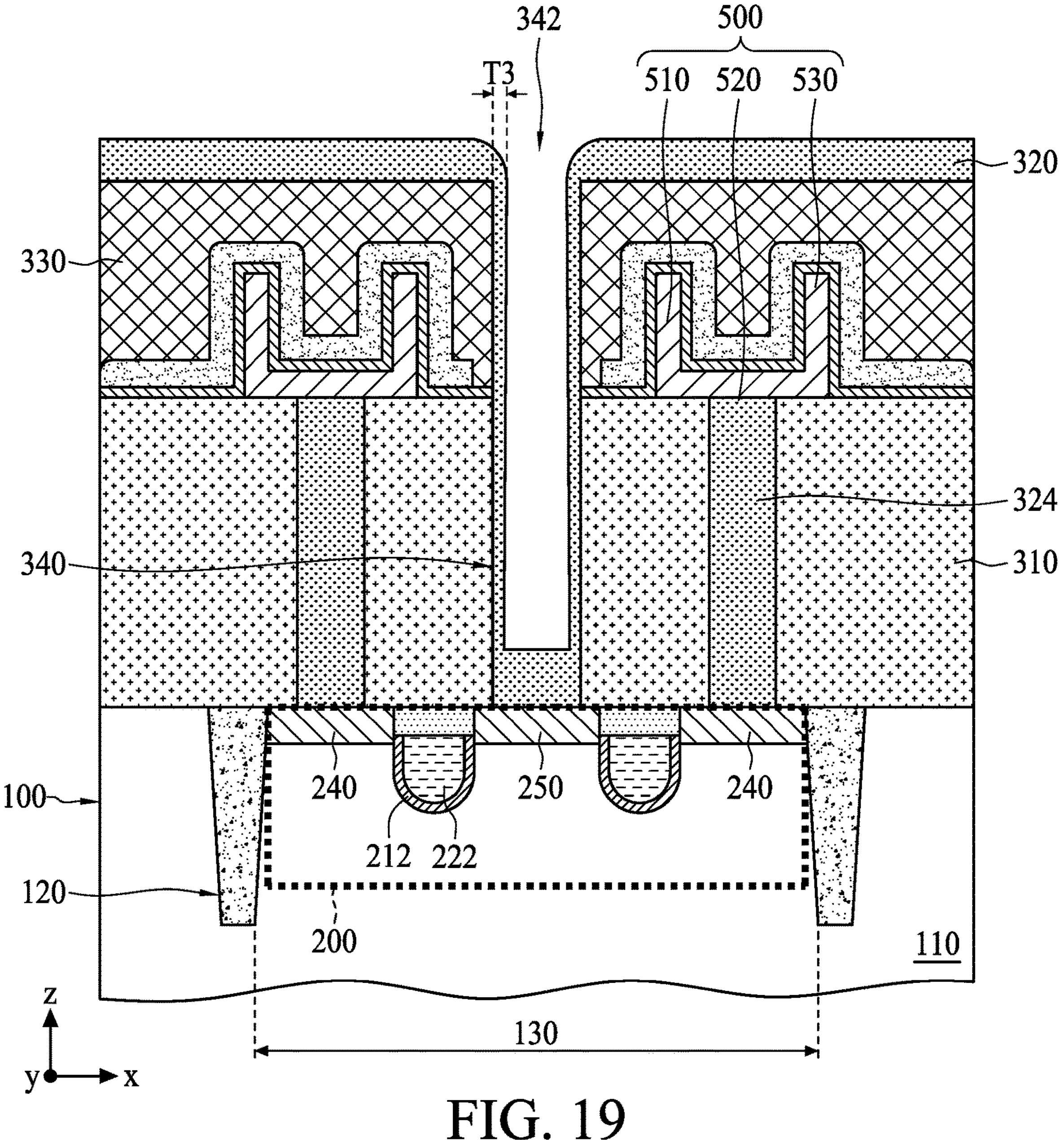
Figure 20:
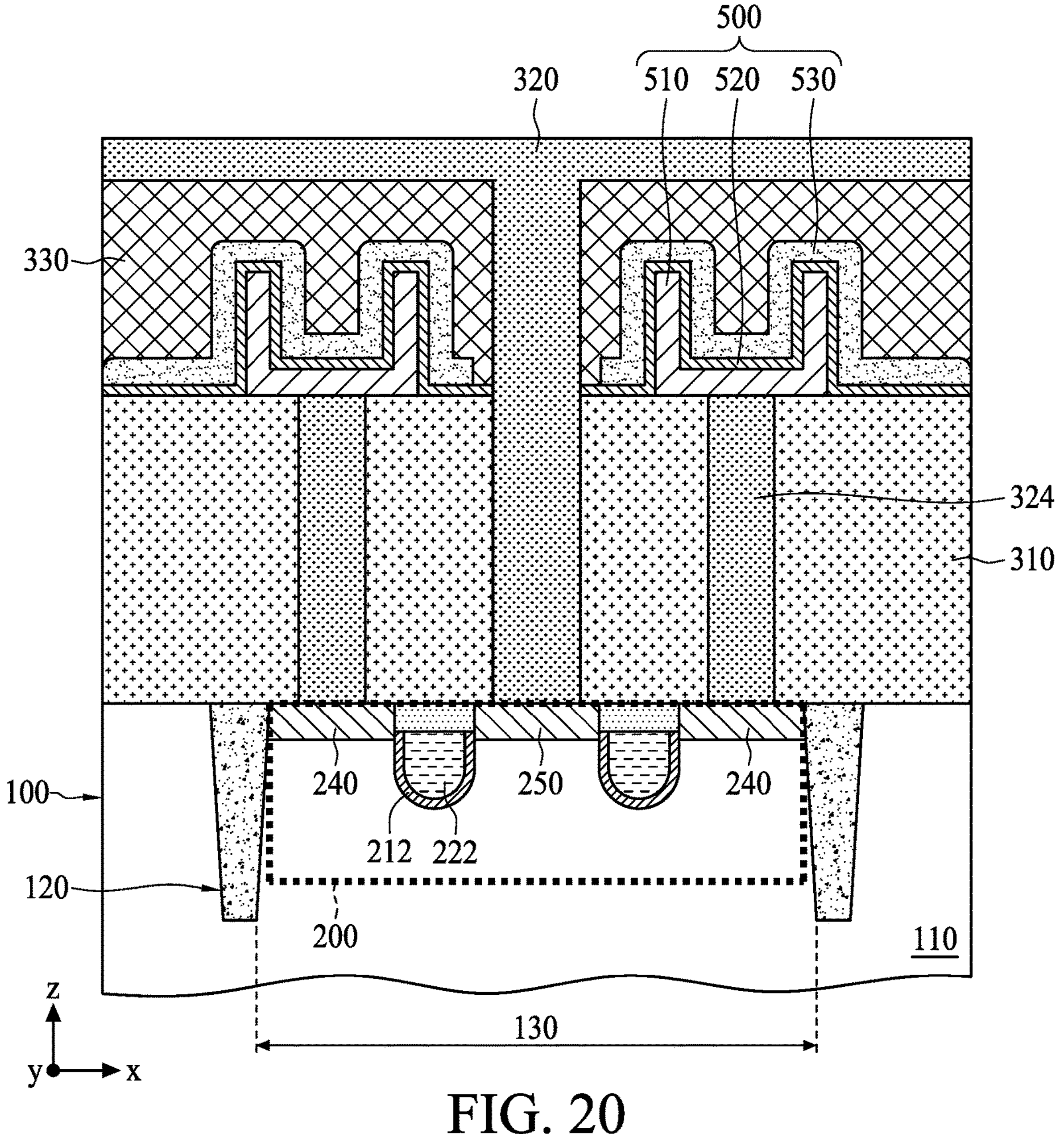

Next, the method proceeds to a step S624 to remove portions of previously deposited conductive material 320 from regions where deposition is not desirable but could not have been avoided, as shown in FIG. 19, thereby preventing the upper end 342 of the second trench 340 from being blocked, which would leave a void in the finished product.

After the removal step is completed, the method 600 proceeds to a step S626, in which it is determined whether a number of times the cyclic process has been performed is equal to a preset number of times. In the step S626, it is not only determined whether a number of times the deposition step has been conducted is equal to a first preset number of times, but also determined whether a number of times the removal step has been conducted is equal to a second preset number of times. The first and second preset number of times may be found using trial-and-error tests to ensure that the top opening of the second trench 340 is not blocked before a bottom-up fill has been completed. In the step S626, if the number of times the deposition step has been conducted is less than the first preset number of times or if the number of times the removal step has been performed is less than the second preset number of times, the method 600 repeats the step S622 of deposition and the step S624 of removing a portion of the conductive material 320. If, on the other hand, the number of times the deposition step has been conducted has reached the first preset number of times and the number of times the removal step has been conducted has reached the second preset number of times, the method 600 proceeds to a step S627, in which a final deposition process is performed to completely fill the second trench 340 with the conductive material 320, as shown in FIG.

Figure 21:
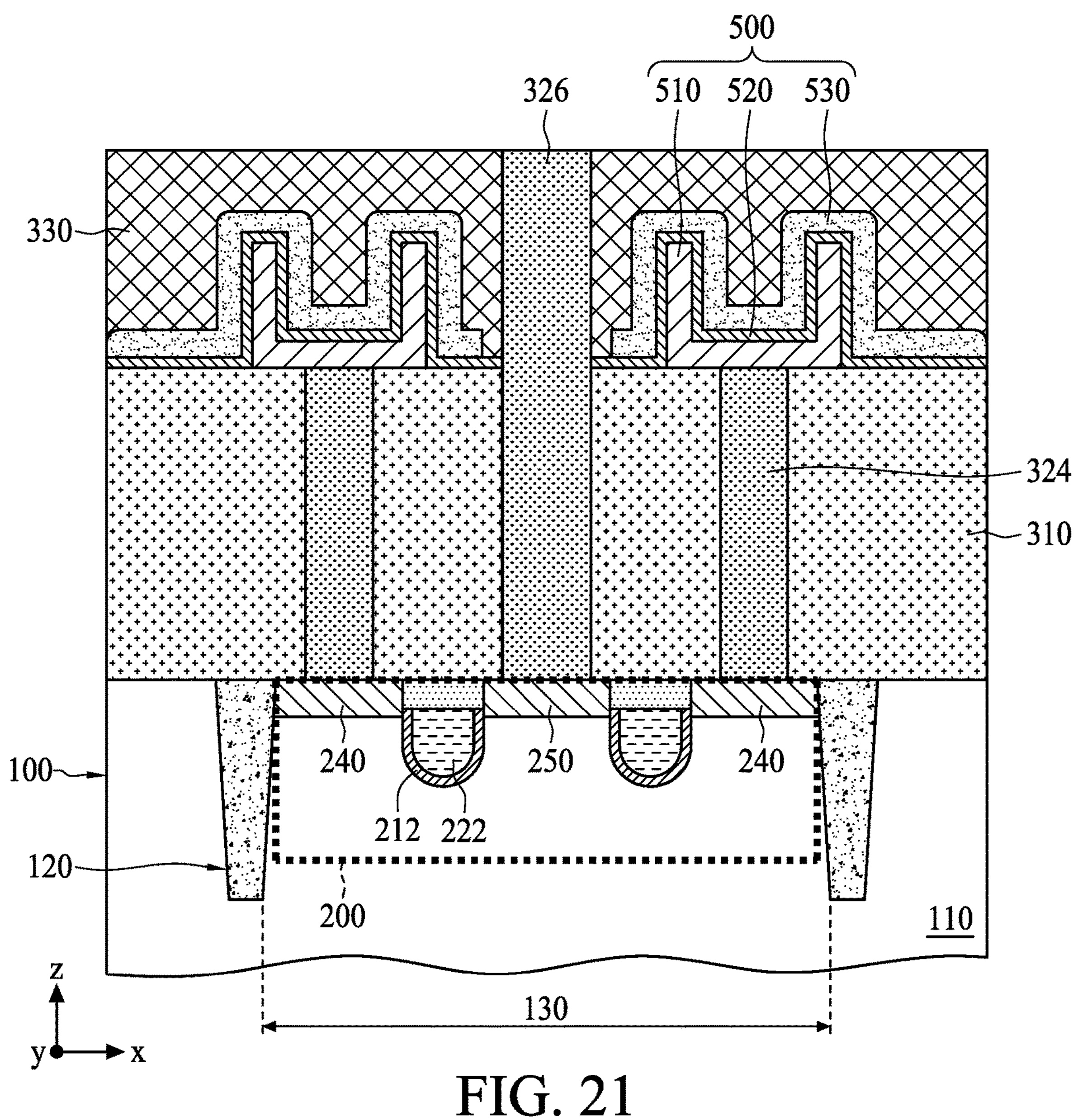

Referring to FIG. 21, a planarization process is performed to remove portions of the conductive material 320 above the isolation layer 330 according to a step S628. Consequently, at least one second conductive feature 326 is formed. The planarization process can include a CMP process and/or a wet etching process.

Next, in a step S630, a bit line 350 is formed on the second conductive feature 326 and the isolation layer 330. The bit line 350 is connected to the second conductive feature 326. Consequently, the semiconductor device 10, shown in FIG. 1, is completely formed.

In conclusion, with the cyclic process including the sequence of the deposition step and the removal step, the overhangs 322 at the upper ends 314 of the first trenches 312 and at the upper end 342 of the second trench 340 are trimmed before the openings to the first and second trenches 312 and 340 are blocked; therefore, the first and second conductive features 324 and 326 can be created in the void-free manner.

One aspect of the present disclosure provides a method of fabricating a conductive feature. The method comprises steps of depositing an insulative layer on a substrate, forming a trench in the insulative layer, and performing a cyclic process comprising a sequence of a deposition step and a removal step to deposit a conductive material in the trench until a number of times the deposition step has been performed is equal to a first preset number of times and a number of times the removal step has been performed is equal to a second preset number of times, and filling the trench with the conductive material after the cyclic process.

One aspect of the present disclosure provides a method of fabricating a conductive feature. The method comprises steps of depositing an insulative layer on a substrate, forming a trench in the insulative layer, performing a cyclic process comprising a sequence of a deposition step and a removal step to deposit a conductive material in the trench until a height of the conductive material in the trench is greater than a predetermined height, and filling the trench with the conductive material after the cyclic process.

One aspect of the present disclosure provides a method of manufacturing a semiconductor device. The method comprises steps of forming a transistor in a substrate; depositing an insulative layer on the substrate; forming a first trench penetrating through the insulative layer to expose a first impurity region of the transistor; performing a first cyclic process comprising a first sequence of a first deposition step and a first removal step to deposit a conductive material in the first trench until a height of the conductive material in the first trench is greater than a predetermined height; filling the first trench with the conductive material after the first cyclic process to thus form a first conductive feature; forming a storage capacitor contacting the first conductive feature; depositing an isolation layer to cover the insulative layer and the storage capacitors; forming a second trench penetrating through the isolation layer and the insulative layer to expose a second impurity region of the transistor; performing a seconds cyclic process comprises a second sequence of a second deposition step and a second removal step to deposit the conductive material in the second trench until a number of times the second deposition step has been performed is equal to a third preset number of times and a number of times the second removal step has been performed is equal to a fourth preset number of times; filling the second trench with the conductive material after the second cyclic process to thus form a second conductive feature; and forming a bit line connected to the second conductive feature.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A method of manufacturing a semiconductor device, comprising:

forming a transistor in a substrate;

depositing an insulative layer on the substrate;

forming a first trench penetrating through the insulative layer to expose a portion of a first impurity region of the transistor;

performing a first cyclic process comprising a first sequence of a first deposition step and a first removal step to deposit a conductive material in the first trench until a height of the conductive material in the first trench is greater than a predetermined height;

filling the first trench with the conductive material after the first cyclic process to thus form a first conductive feature;

forming a storage capacitor contacting the first conductive feature;

depositing an isolation layer to cover the insulative layer and the storage capacitor;

forming a second trench penetrating through the isolation layer and the insulative layer to expose a portion of a second impurity region of the transistor;

performing a second cyclic process comprising a second sequence of a second deposition step and a second removal step to deposit the conductive material in the second trench until a number of times of the second deposition step has been performed is equal to a third preset number of times and a number of times of the second removal step has been performed is equal to a fourth preset number of times;

filling the second trench with the conductive material after the second cyclic process to thus form a second conductive feature; and forming a bit line connected to the second conductive feature;

wherein the first deposition step of the first cyclic process terminates before an upper end of the first trench is blocked, or the second deposition step of the second cyclic process terminates before an upper end of the second trench is blocked;

wherein during the formation of the first conductive feature, the first deposition step is conducted until a first thickness of the conductive material accumulated at the upper end of the first trench is equal to one quarter of a width of the first trench, or during the formation of the second conductive feature, the second deposition step is conducted until a second thickness of the conductive material accumulated at the upper end of the second trench is equal to one quarter of a width of the second trench.

2. The method of claim 1, wherein the first removal step is conducted to at least remove a portion of the conductive material accumulated at the upper end of the first trench, or the second removal step is conducted to at least remove a portion of the conductive material accumulated at the upper end of the second trench.

3. A method of manufacturing a semiconductor device, comprising:

forming a transistor in a substrate;

depositing an insulative layer on the substrate;

forming a first trench penetrating through the insulative layer to expose a portion of a first impurity region of the transistor;

performing a first cyclic process comprising a first sequence of a first deposition step and a first removal step to deposit a conductive material in the first trench until a height of the conductive material in the first trench is greater than a predetermined height;

filling the first trench with the conductive material after the first cyclic process to thus form a first conductive feature;

forming a storage capacitor contacting the first conductive feature;

depositing an isolation layer to cover the insulative layer and the storage capacitor;

forming a second trench penetrating through the isolation layer and the insulative layer to expose a portion of a second impurity region of the transistor;

performing a second cyclic process comprising a second sequence of a second deposition step and a second removal step to deposit the conductive material in the second trench until a number of times of the second deposition step has been performed is equal to a third preset number of times and a number of times of the second removal step has been performed is equal to a fourth preset number of times;

filling the second trench with the conductive material after the second cyclic process to thus form a second conductive feature; and forming a bit line connected to the second conductive feature;

wherein the first removal step removes the conductive material isotropically from the first trench, and the second removal step removes the conductive material isotropically from the second trench.

4. The method of claim 1, wherein the first trench and the second trench respectively have a height-to-width aspect ratio of greater than or equal to 5.

5. The method of claim 4, wherein the height-to-width aspect ratio is in a range of between 6 and 8.

6. The method of claim 1, further comprising performing planarization processes to remove the conductive material overflowing the first trench after the conductive material completely fills the first trench and to remove the conductive material above the isolation layer after the second trench is filled with the conductive material.

7. A method of manufacturing a semiconductor device, comprising:

forming a transistor in a substrate;

depositing an insulative layer on the substrate;

forming a first trench penetrating through the insulative layer to expose a portion of a first impurity region of the transistor;

performing a first cyclic process comprising a first sequence of a first deposition step and a first removal step to deposit a conductive material in the first trench until a height of the conductive material in the first trench is greater than a predetermined height;

filling the first trench with the conductive material after the first cyclic process to thus form a first conductive feature;

forming a storage capacitor contacting the first conductive feature;

depositing an isolation layer to cover the insulative layer and the storage capacitor;

forming a second trench penetrating through the isolation layer and the insulative layer to expose a portion of a second impurity region of the transistor;

performing a second cyclic process comprising a second sequence of a second deposition step and a second removal step to deposit the conductive material in the second trench until a number of times of the second deposition step has been performed is equal to a third preset number of times and a number of times of the second removal step has been performed is equal to a fourth preset number of times;

filling the second trench with the conductive material after the second cyclic process to thus form a second conductive feature; and forming a bit line connected to the second conductive feature;

wherein the predetermined height is equal to one half of a height of the first trench.

8. The method of claim 1, wherein the formation of the transistor comprises:

forming a groove in the substrate;

depositing a gate insulator conformal to the groove;

forming a word line surrounded by the gate insulator;

depositing a capping layer in the groove to cover the word line; and introducing dopants into the substrate to form the first and second impurity regions.

9. The method of claim 8, wherein the substrate comprises an isolation feature defining a plurality of active regions, wherein the groove extends across the plurality of active regions.

10. The method of claim 1, wherein the formation of the storage capacitor comprises:

forming a storage node in contact with the first conductive feature;

depositing a capacitor insulator encapsulating the storage node; and depositing a top electrode on the capacitor insulator.

11. The method of claim 10, further comprising removing a portion of the top electrode above the second impurity region.

12. The method of claim 10, wherein the storage node is in a U-shaped configuration.

* * * * *